United States Patent
Jones et al.

(10) Patent No.: US 9,955,127 B2
(45) Date of Patent: *Apr. 24, 2018

(54) SYSTEMS AND METHODS FOR CREATING FULL-COLOR IMAGE IN LOW LIGHT

(71) Applicant: Chromatra, LLC., Beverly, MA (US)

(72) Inventors: Peter W. J. Jones, Belmont, MA (US); Ellen Cargill, Norfolk, MA (US); Dennis W. Purcell, Medford, MA (US)

(73) Assignee: CHROMATRA, LLC., Beverly, MA (US)

( * ) Notice: Subject to any disclaimer, the term of this patent is extended or adjusted under 35 U.S.C. 154(b) by 236 days.

This patent is subject to a terminal disclaimer.

(21) Appl. No.: 14/928,678

(22) Filed: Oct. 30, 2015

(65) Prior Publication Data
US 2016/0073067 A1    Mar. 10, 2016

Related U.S. Application Data

(63) Continuation of application No. 13/717,198, filed on Dec. 17, 2012, now Pat. No. 9,177,988.
(Continued)

(51) Int. Cl.
| | |
|---|---|
| *H04N 9/04* | (2006.01) |
| *H04N 9/73* | (2006.01) |
| *H01L 27/146* | (2006.01) |
| *G02B 5/20* | (2006.01) |
| *G06K 9/46* | (2006.01) |
| *G06K 9/62* | (2006.01) |
| *H04N 5/33* | (2006.01) |

(Continued)

(52) U.S. Cl.
CPC ............ *H04N 9/045* (2013.01); *G02B 5/208* (2013.01); *G06K 9/4652* (2013.01); *G06K 9/6201* (2013.01); *G06T 7/90* (2017.01); *H01L 27/14645* (2013.01); *H04N 5/33* (2013.01); *H04N 9/735* (2013.01); *H04N 9/77* (2013.01); *H04N 5/35563* (2013.01); *H04N 2005/2255* (2013.01)

(58) Field of Classification Search
CPC ....................................................... H04N 9/735
USPC ............................................................ 348/33
See application file for complete search history.

(56) References Cited

U.S. PATENT DOCUMENTS

| | | |
|---|---|---|
| 2,971,093 A | 2/1961 | Garbuny |
| 3,736,050 A | 5/1973 | Bolum |
| | (Continued) | |

OTHER PUBLICATIONS

Google search for NPL log.*
(Continued)

*Primary Examiner* — Luis Perez Fuentes

(57) ABSTRACT

Full-color images of low-light scenes are generated by the systems and methods described herein using only two light channels. An array of photosensitive pixels includes two sets of pixels, the first sensitive only to light associated with a first light channel, the second only to light associated with a second light channel. Thus the first set of pixels generate a first set of electrical signals in response to incident light within the first light channel, and the second set of pixels generate a second set of electrical signals in response to incident light within the second light channel. An image processor receives the first and second sets of electrical signals and generates a full-color image of the scene by processing only signals generated by the first and second sets of pixels.

16 Claims, 23 Drawing Sheets

Related U.S. Application Data

(60) Provisional application No. 61/609,762, filed on Mar. 12, 2012, provisional application No. 61/576,769, filed on Dec. 16, 2011.

(51) Int. Cl.
    *H04N 9/77* (2006.01)
    *G06T 7/90* (2017.01)
    *H04N 5/355* (2011.01)
    *H04N 5/225* (2006.01)

(56) References Cited

U.S. PATENT DOCUMENTS

| | | | |
|---|---|---|---|
| 4,085,421 A | 4/1978 | Gilmour | |
| 4,679,068 A | 7/1987 | Lillquist et al. | |
| 4,800,474 A | 1/1989 | Bornhorst | |
| 5,214,503 A | 5/1993 | Chiu et al. | |
| H1599 H * | 10/1996 | Task | 348/32 |
| 5,812,187 A | 9/1998 | Watanabe | |
| 5,986,767 A | 11/1999 | Nakano et al. | |
| 6,327,093 B1 | 12/2001 | Nakanishi et al. | |
| 8,130,292 B2 * | 3/2012 | Lee | H04N 5/2354 348/251 |
| 8,259,201 B2 * | 9/2012 | Stuck | H01L 27/14609 250/208.1 |
| 8,295,631 B2 * | 10/2012 | Adams, Jr. | H04N 9/045 358/3.26 |
| 8,988,590 B2 * | 3/2015 | Gillet | H04N 5/23212 235/462.42 |
| 9,177,988 B2 * | 11/2015 | Jones | H04N 9/735 |
| 2001/0019363 A1 | 9/2001 | Katta et al. | |
| 2001/0045988 A1 * | 11/2001 | Yamauchi | G06T 1/60 348/273 |
| 2002/0067560 A1 * | 6/2002 | Jones | G02B 23/12 359/885 |
| 2004/0086186 A1 | 5/2004 | Kyusojin et al. | |
| 2004/0212677 A1 | 10/2004 | Uebbing | |
| 2004/0247173 A1 | 12/2004 | Nielsen et al. | |
| 2006/0017829 A1 | 1/2006 | Gallagher | |
| 2006/0088298 A1 | 4/2006 | Frame et al. | |
| 2006/0125921 A1 | 6/2006 | Foote | |
| 2006/0187326 A1 | 8/2006 | Spencer | |
| 2009/0296247 A1 | 12/2009 | Jones et al. | |
| 2010/0245636 A1 | 9/2010 | Kumar et al. | |

OTHER PUBLICATIONS

International Search Report and Written Opinion dated Feb. 16, 2013 for International Application No. PCT/US12/707170, International Filing Date Dec. 17, 2012.

* cited by examiner

Pixel Pattern 900

| Pixel 902 | Pixel 904 | Pixel 904 | Pixel 902 |
| --- | --- | --- | --- |
| Pixel 904 | Pixel 902 | Pixel 904 | Pixel 904 |
| Pixel 904 | Pixel 904 | Pixel 902 | Pixel 904 |
| Pixel 902 | Pixel 904 | Pixel 904 | Pixel 902 |

Fig. 9

Pixel Pattern 1000

| Pixel 1002 | Pixel 1004 | Pixel 1004 | Pixel 1004 |
|---|---|---|---|
| Pixel 1004 | Pixel 1004 | Pixel 1002 | Pixel 1004 |
| Pixel 1004 | Pixel 1002 | Pixel 1004 | Pixel 1004 |
| Pixel 1004 | Pixel 1004 | Pixel 1004 | Pixel 1002 |

Fig. 10

Pixel Pattern 1100

| Pixel 1102 | Pixel 1104 | Pixel 1104 | Pixel 1104 |
| --- | --- | --- | --- |
| Pixel 1104 | Pixel 1104 | Pixel 1104 | Pixel 1104 |
| Pixel 1102 | Pixel 1104 | Pixel 1102 | Pixel 1104 |
| Pixel 1104 | Pixel 1102 | Pixel 1104 | Pixel 1102 |

Fig. 11

Pixel Pattern 1200

| Pixel 1204 | Pixel 1204 | Pixel 1202 | Pixel 1204 |
|---|---|---|---|
| Pixel 1204 | Pixel 1204 | Pixel 1204 | Pixel 1204 |
| Pixel 1204 | Pixel 1204 | Pixel 1204 | Pixel 1204 |
| Pixel 1202 | Pixel 1202 | Pixel 1204 | Pixel 1202 |

Fig. 12

Pixel Pattern 1300

| Pixel 1304 | Pixel 1304 | Pixel 1304 | Pixel 1304 |
|---|---|---|---|
| Pixel 1304 | Pixel 1302 | Pixel 1302 | Pixel 1304 |
| Pixel 1304 | Pixel 1302 | Pixel 1302 | Pixel 1304 |
| Pixel 1304 | Pixel 1304 | Pixel 1304 | Pixel 1304 |

Fig. 13

SYSTEMS AND METHODS FOR CREATING FULL-COLOR IMAGE IN LOW LIGHT

CROSS-REFERENCE TO RELATED APPLICATIONS

This Application is a continuation of U.S. patent application Ser. No. 13/717,198, filed Dec. 17, 2012 (allowed), which claims the benefit under 35 U.S.C. § 119(e) of U.S. Provisional Application 61/576,769, filed Dec. 16, 2011 and, U.S. Provisional Application 61/609,762, filed on Mar. 12, 2012, each of which are hereby incorporated by reference herein in their entireties.

BACKGROUND

Many fields demand low-light imaging and video. Security cameras must often record minimally illuminated scenes; most marine environments receive little sunlight; the human body does not admit much of the light required for medical endoscopy.

A number of modern image sensor technologies have been developed to satisfy these demands. These modern low-light image sensors are, at their base, a digital camera. A digital camera replaces photosensitive film with an array of photoelectric sensors. The camera lens focuses an image onto the sensor array; each sensor produces an electrical signal proportional to the intensity of the light falling upon it; and the digital camera's processor converts the signals from the array of sensor into an image. To record the color of the light falling on a sensor, digital cameras typically include a color filter array (CFA) disposed over the sensor array. Each filter of the CFA transmits specific wavelengths of light. These digital cameras take color pictures by measuring the intensity of incoming light passing through the CFA. One example of a typical CFA is the RGB Bayer pattern, described in U.S. Pat. No. 3,971,065 and composed of red, green, and blue (RGB) filters in a checkerboard pattern. Red-filtered sensors measure the intensity of the red light that passes through the red filters, green-filtered sensors measure the intensity of the green light that passes through the green filters, and blue-filtered sensors measure the intensity of the blue light that passes through the blue filters. A digital camera processor typically interpolates the red, green, and blue intensity data to assign an RGB value to each sensor. Currently, several approaches within this digital camera paradigm have been used to produce digital cameras in general, and low-light cameras in specific. These methods include charge-coupled device (CCD) cameras and variations on active-pixel sensor cameras produced using the complementary metal oxide semiconductor process (CMOS cameras).

CCD cameras typically include a two-dimensional array of photosensitive elements or photoelectric sensors. Each element is coupled to a capacitor that can store light intensity information as a quantity of charge. One example of an image-sensing CCD is depicted in FIG. 3. The array of capacitors transfers the stored charge to a charge amplifier, which converts the charge into a readily measured voltage. The capacitors transfer charge down and across the CCD array until the entire CCD has been read. Most CCD cameras include an RGB Bayer CFA overlaid on the sensor array to discern colors.

Although CCD technology offers high light sensitivity and low noise, it suffers from several disadvantages. The charge generated in a CCD pixel array is transferred as an analog signal through only a few output nodes, requiring a higher data transfer rate and at least an analog-to-digital converter (ADC) outside the sensor. CCDs thus take up more space than comparable non-CCD sensors. Moreover, CCDs can consume up to 100 times as much power as comparable non-CCD sensors, generating heat that can degrade image quality. Additionally, light may be falsely recorded during the reading process: if light falls on a pixel while charge is being transferred between pixels, the light will increase the charge associated with a different pixel, erroneously creating a "smear" of light in the recorded image.

In contrast with CCDs, every pixel of a CMOS camera sensor includes its own amplifier. These active-pixel sensors can be made using the common complementary metal-oxide semiconductor (CMOS) process, and are thus commonly referred to as CMOS sensors. Like CCD cameras, CMOS cameras typically include an RGB Bayer CFA to discern color. The CMOS process allows more features to be added to the CMOS sensor. For example, image processing can be performed on the CMOS sensor chip, and adding an amplifier and an analog-to-digital converter to each pixel eliminates the data bottlenecks of CCD sensors. CMOS sensors thus take higher-resolution images more rapidly and efficiently than CCD cameras while eliminating smear. However, the additional circuitry surrounding each pixel in a CMOS sensor reduces the light sensitivity of CMOS sensors relative to CCDs, a particular disadvantage in low-light applications. To improve the low-light performance of CMOS sensors, researchers have developed several techniques, including frontside illumination (FSI) optimization, backside illumination (BSI), and direct CMOS systems.

A standard CMOS pixel places circuitry above the photosensitive layer. This circuitry scatters some of the light entering the CMOS pixel, reducing the effective sensitivity of the sensor. The FSI optimization technique uses a number of methods to reduce light scattering by the circuitry, including adding a waveguide to the pixel and applying antireflective coatings to the pixel array.

The BSI technique places the photosensitive layer directly behind the color filters and the circuitry behind the photosensitive layer. BSI may suffer from cross-talk, where data from one pixel creates noise by bleeding into nearby pixels. Both BSI and optimized FSI require relatively new manufacturing techniques. Moreover, despite the substantial changes in structure, both FSI and BSI techniques can claim no more than modest improvements in low-light conditions.

Direct CMOS cameras attempt to improve the low-light performance of CMOS sensors by replacing a single pixel covered by a red, green, or blue filter with a stack of three photodiodes embedded in silicon. Red, green, and blue light penetrate silicon to different depths, so different layers absorb primarily red, green, or blue light. A direct CMOS system thus acquires full-color information without a CFA, and thereby offers greater low-light sensitivity and higher resolution than a traditional RGB system. But each of the photodiodes is made of silicon: each photodiode absorbs overlapping portions of the spectrum. This overlap creates issues of color accuracy, particularly in low-light conditions. Moreover, as a direct CMOS system must acquire data for three different photodetectors per pixel, it is appreciably more difficult to manufacture than a standard CMOS system.

Accordingly, there is still a need for an improved low-light image sensor.

SUMMARY

Current technologies for low-light image sensors rely on substantial changes to the sensor structure itself, but all rely on three light channels: that is, all rely on measuring intensities associated with three different sets of wavelengths of electromagnetic radiation. It is widely believed that three light channels are required for good color reproduction, as indeed the human eye is itself a three-light-channel system. However, the inventors have recognized that the common RGB Bayer CFA filters out approximately two-thirds of incoming light, and other three-channel systems present similar problems. The inventors have developed a two-light-channel system that can differentiate a set of predetermined colors without the disadvantages of three-light-channel systems. As an illustrative example, a two-light-channel system may produce a full-color image, allowing a viewer to correctly identify a car as green rather than red or blue where an equivalent three-channel device would barely generate a signal. Leaving the three-channel paradigm will increase the amount of available light regardless of whether the sensor is a CCD, a FSI CMOS, or a BSI CMOS, allowing color identification in lower-light conditions. And as a two-light-channel array uses fewer colors to differentiate the same number of pixels, a two-light-channel system is less susceptible to noise than an equivalent three-channel system. The systems and methods described herein further include techniques to define the light channels of an imaging system, to automatically identify colors in a digital image, to process colors in an image with multiple light sources, and to increase the dynamic range of digital sensors.

Accordingly, in one aspect the systems and methods described herein relate to generating color images using an array of photosensitive pixels configured to generate electrical signals in response to incident light from a scene. The array comprises two pluralities of pixels, the first sensitive only to light associated with a first light channel, the second sensitive only to light associated with a second light channel. Pixels sensitive to a light channel generate an electrical signal only in response to incident light within the light channel. Pixels of the first plurality thus generate a first set of electrical signals in response to incident light within the first light channel, and pixels of the second plurality generate a second set of electrical signals in response to incident light within the second light channel. An image processor receives the first and second set of electrical signals and generates a full-color image by processing only signals generated by the first and second pluralities of photosensitive pixels of the array, thereby using only two light channels to generate a full-color image.

In another aspect, the systems and methods described herein relate to generating color images using an array of photosensitive elements and a color filter array (CFA). The array of photosensitive elements is configured to generate electrical signals in response to incident light from a scene. The CFA filters light from a scene into only two light channels, wherein a light channel is at least one band of wavelength of light, and may include more than one non-contiguous bands of wavelengths. The CFA is disposed in front of the array of photosensitive elements such that each element of the photosensitive array receives light within only one of the two light channels passed by the color filter array. An image processor connected to the array of photosensitive elements generates a full-color image based on the electrical signals generated by the array of photosensitive elements, thereby using only two light channels to generate a full-color image.

In another aspect, the systems and methods described herein relate to generating color images using an array of preselected photosensitive pixels configured to generate electrical signals in response to incident light from a scene. The pixels are preselected such that there are at least two pluralities of pixels. Each pixel in a plurality of pixels is sensitive to a single light channel, wherein a light channel is at least one band of wavelength of light, and may include more than one noncontiguous bands of wavelengths. Pixels sensitive to a light channel generate an electrical signal only in response to incident light within the light channel. The pixels are preselected such that, in a color space having axes corresponding to the light channels represented by the pixels, the distances between elements of a predetermined set of reference colors is no smaller than a predetermined threshold. An image processor receives a set of electrical signals from each plurality of pixels, and generates a full-color image by processing the signals.

In certain implementations, the full-color image generated may allow a viewer to distinguish between predetermined colors, including at least one of a set of primary colors, natural colors, and artificial colors. Illustrative examples of such implementations include full-color images in which a viewer may distinguish red, yellow, green, and blue, or between the color of healthy tissue and the color of diseased tissue, or between the color of foliage and the color of water.

In certain implementations, the first and second pluralities of pixels may be configured such that, in a color space having axes corresponding to signals from the first and second pluralities of pixels, the distances between elements of a predetermined set of reference colors is no smaller than a predetermined threshold. As an illustrative example of such implementations, two light channels may be selected such that no two colors out of the set of red, yellow, green, and blue will generate the same response in both light channels. As another illustrative example, at least one of the first plurality of pixels and the second plurality of pixels will generate different signals in response to the spectrum of diseased tissue than in response to the spectrum of healthy tissue. In certain such implementations, at least one of the first or second pluralities of pixels may be selected from a predetermined set of possible pixels.

In certain implementations, the image processor may be configured to generate full-color images of a scene having an ambient light intensity of less than about 0.2 lux at a rate of fifteen images per second.

In certain implementations, the image processor may be further configured to convert a full-color image into an RGB image.

In certain implementations, each pixel of the first plurality of photosensitive pixels includes a color filter blocking light not associated with the first light channel. In some such implementations, each pixel of the second plurality of photosensitive pixels may not include a color filter.

In certain implementations, a color database may associate a combination of a first signal associated with a first light channel and a second signal associated with a second light channel with one of a set of predetermined reference colors. In such implementations, a color processor may identify a color in the full-color image as an element of the set of predetermined reference colors based on the associations recorded in the color database.

In certain implementations, the first plurality of photosensitive pixels or the second plurality of photosensitive pixels may be sensitive to visible light, non-visible light, or both, where non-visible light may include infrared and ultraviolet radiation. In some such implementations, the first and the second pluralities of photosensitive pixels may have substantially the same sensitivity to wavelengths of non-visible light.

In certain implementations, the image processor may be further configured to scale a signal generated by a first photosensitive pixel as a function of distance between the first photosensitive pixel and a photosensitive pixel generating a strong signal. Some such implementations may perform white balance for images with more than one light source.

In certain implementations, the second plurality of photosensitive pixels may comprise a third and a fourth plurality of photosensitive pixels, wherein a pixel of the third plurality generates a weaker signal than a pixel of the fourth plurality in response to a substantially identical light input. Some such implementations may be used to record details of both brightly and dimly lit portions of a scene.

In certain implementations, a photosensitive pixel of the first plurality is placed at the light-input end of a photosensitive pixel of the second plurality. In some such implementations, a first signal and a second signal may be generated at each point of the pixel array.

In certain implementations, the photosensitive pixels associated with the first plurality and the photosensitive pixels associated with the second plurality are arranged in a substantially checkerboard pattern.

BRIEF DESCRIPTION OF THE DRAWINGS

The systems and methods described herein are set forth in the appended claims. However, for the purpose of explanation, several implementations are set forth in the following figures.

FIGS. 8-13 are views of exemplary color filter array patterns;

DETAILED DESCRIPTION

In the following description, numerous details are set forth for the purpose of explanation. However, one of ordinary skill in the art will realize that the implementations described herein may be practiced without the use of these specific details and that the implementations described herein may be modified, supplemented, or otherwise altered without departing from the scope of the invention.

Figure 1:
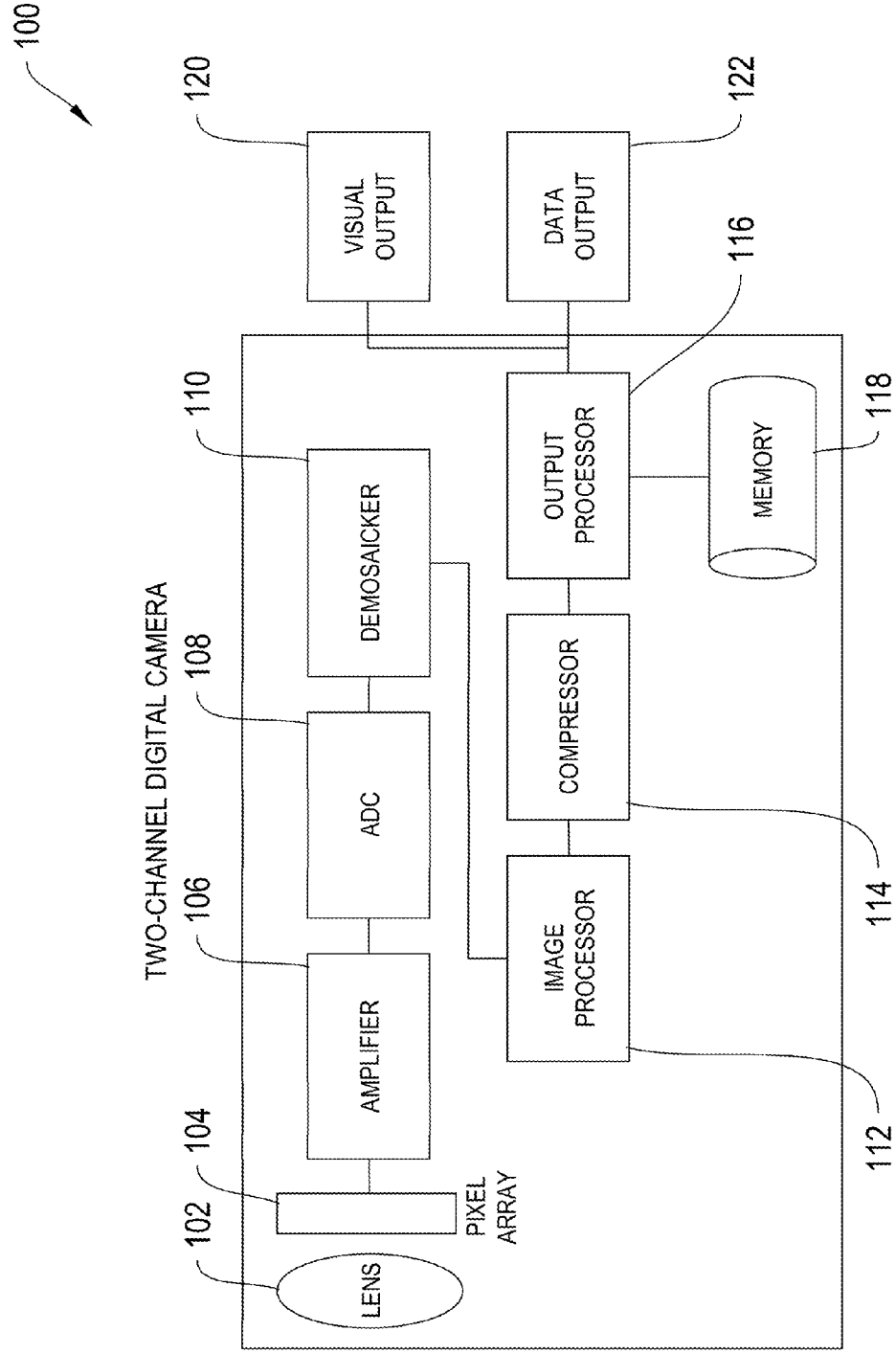
FIG. 1 is a block diagram of a digital camera using a two-light-channel sensor, according to an illustrative implementation.
Figure 2:
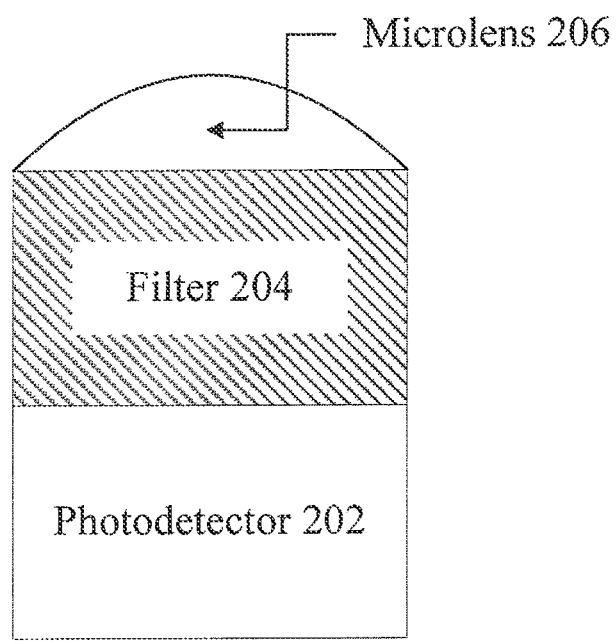
FIG. 2 is a block diagram of a photosensitive pixel, according to an illustrative implementation.
Figure 3:
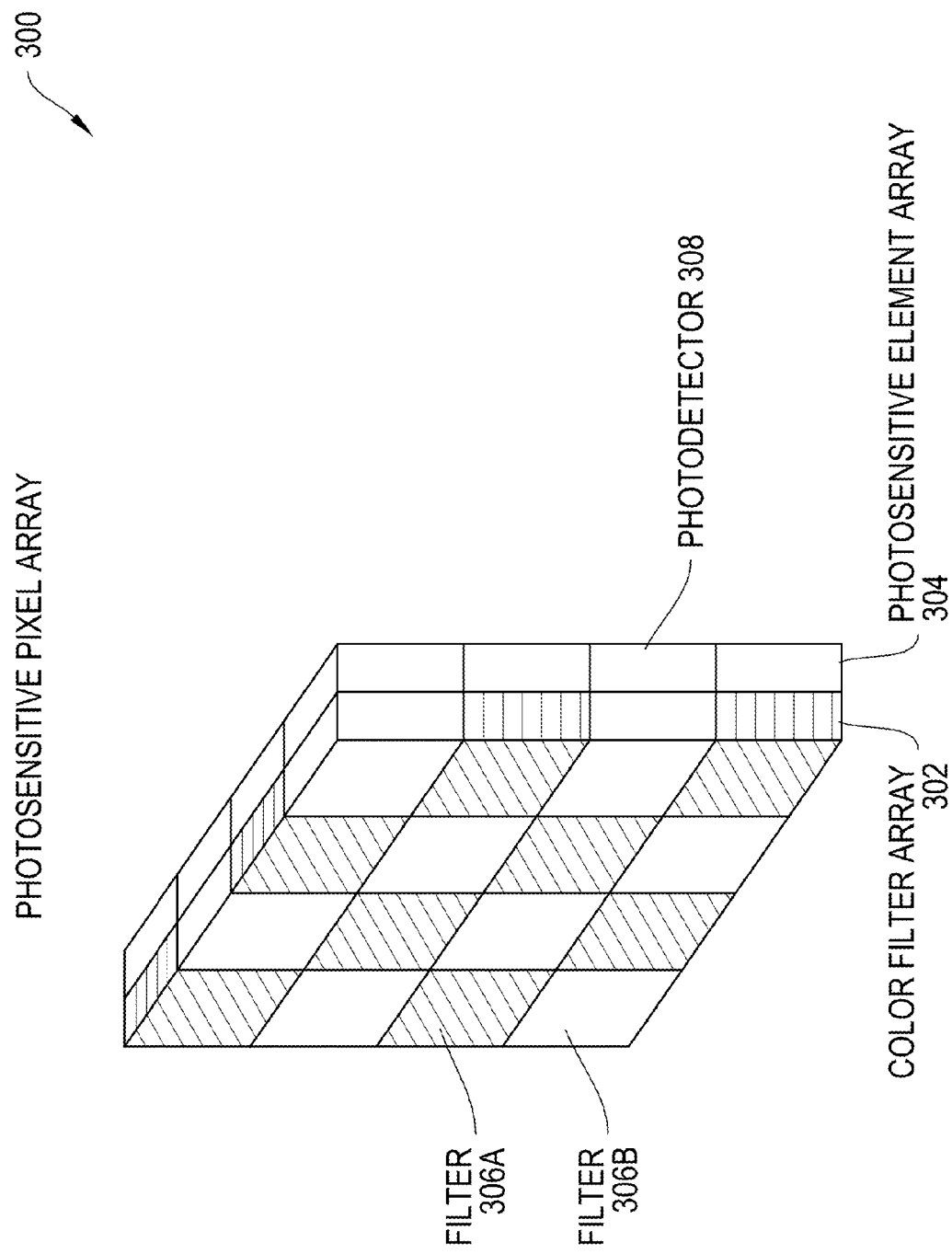
FIG. 3 is a block diagram of an array of photosensitive pixels, according to an illustrative implementation.
Figure 4:
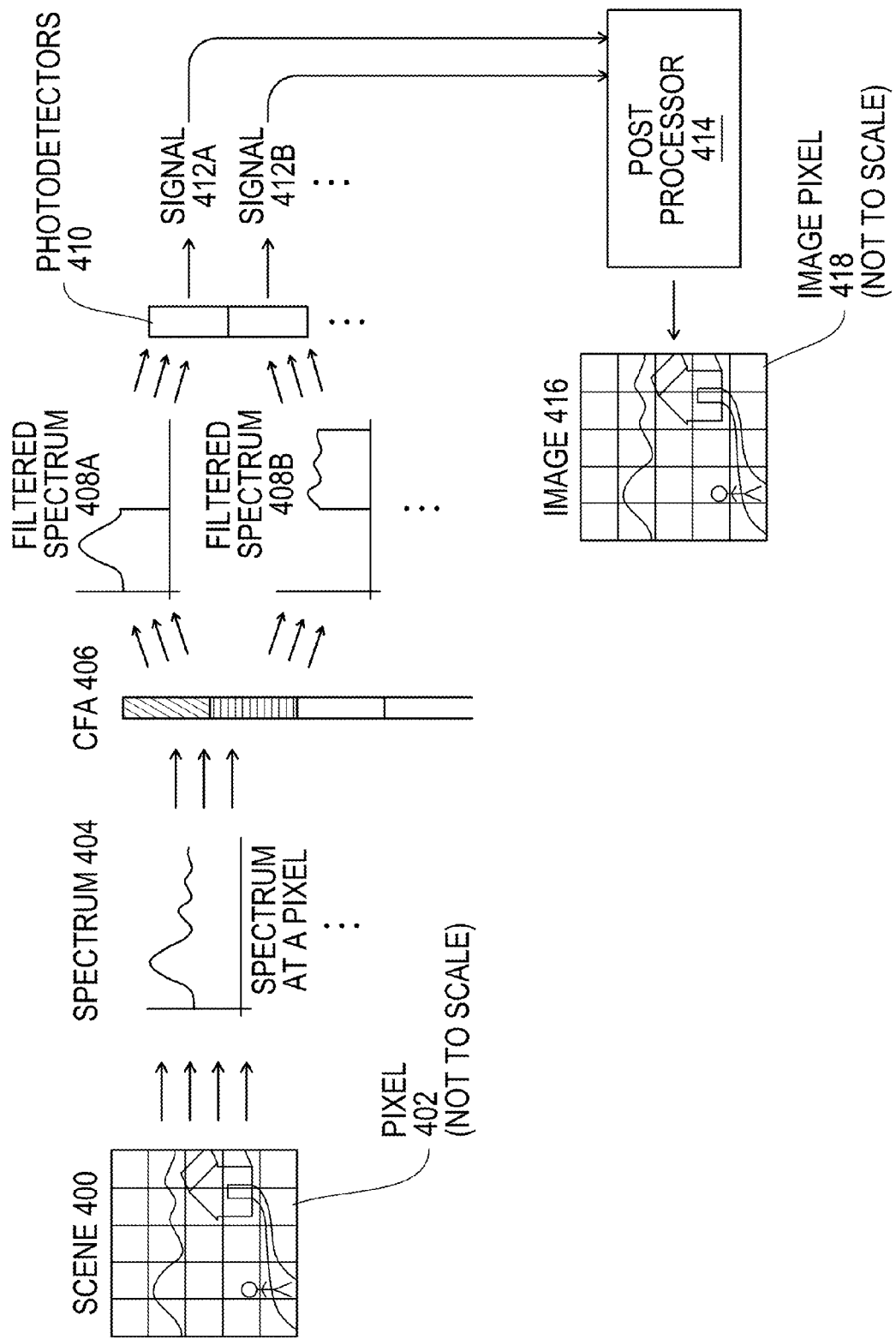
FIG. 4 depicts an illustrative implementation of an image generation process.
Figure 5:
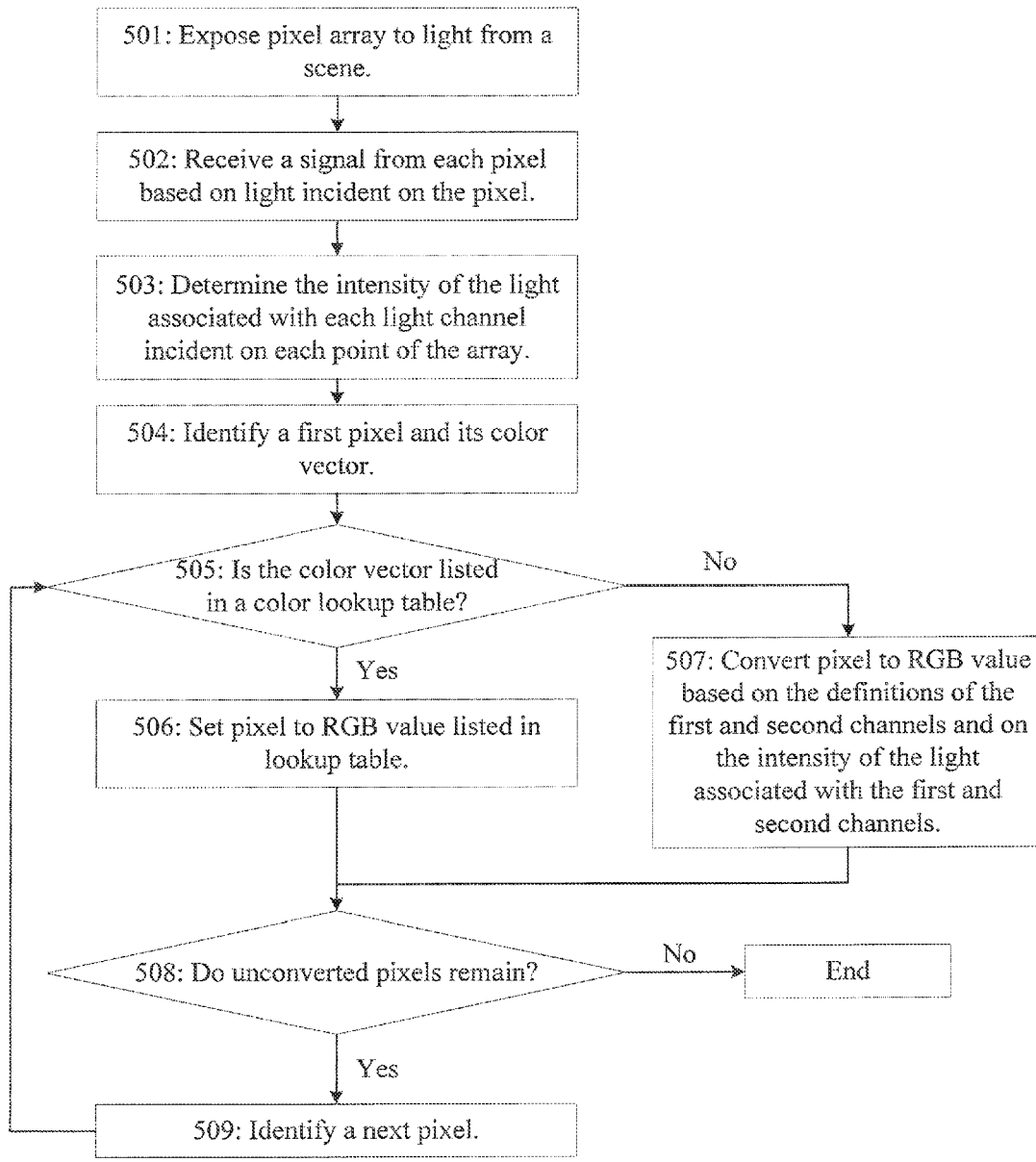
FIG. 5 is a flow chart of a process for generating a color image, according to an illustrative implementation.
Figure 6:
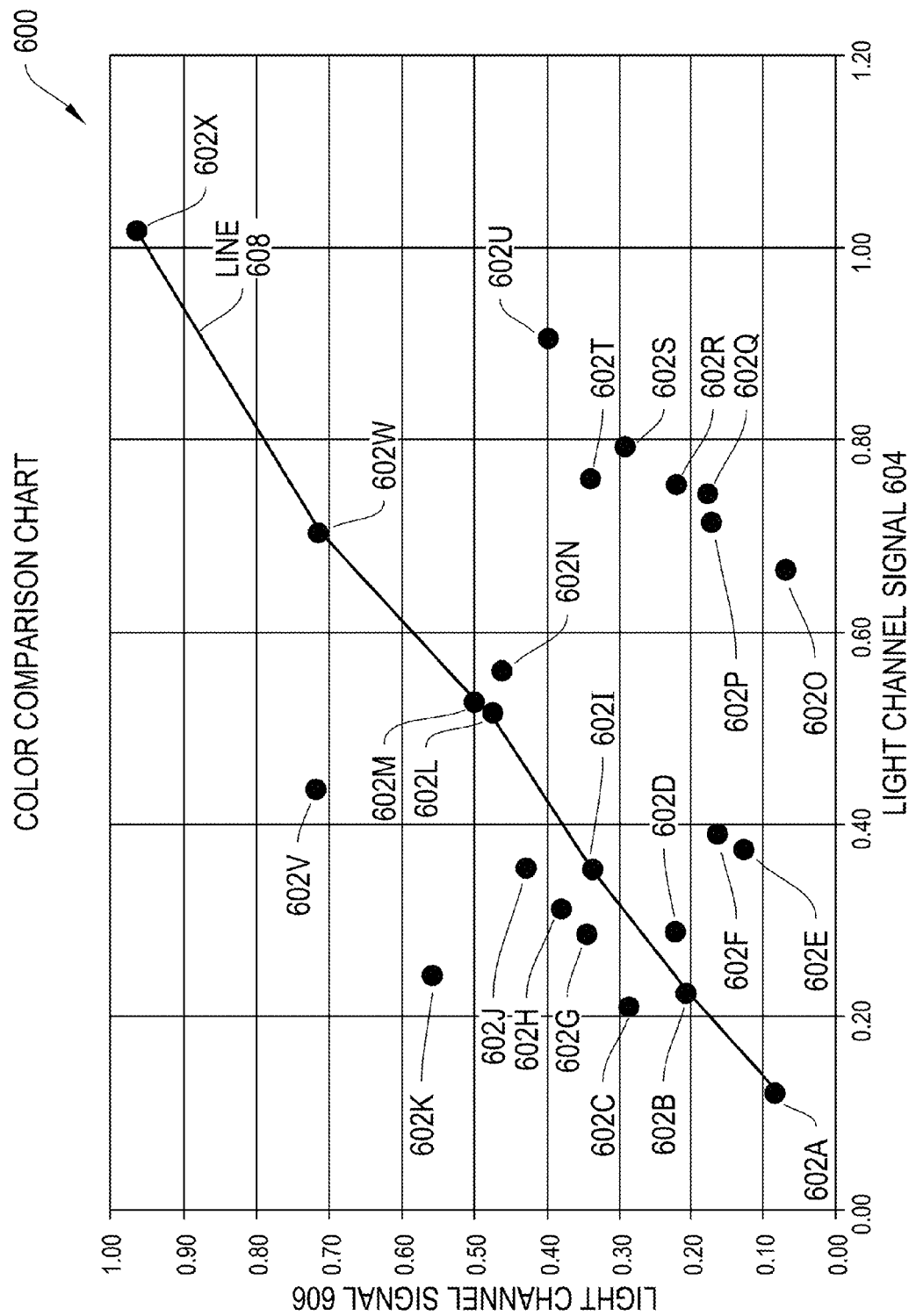
FIG. 6 is a graph illustrating the distinctions between colors in an exemplary two-light-channel imaging system.
Figure 7:
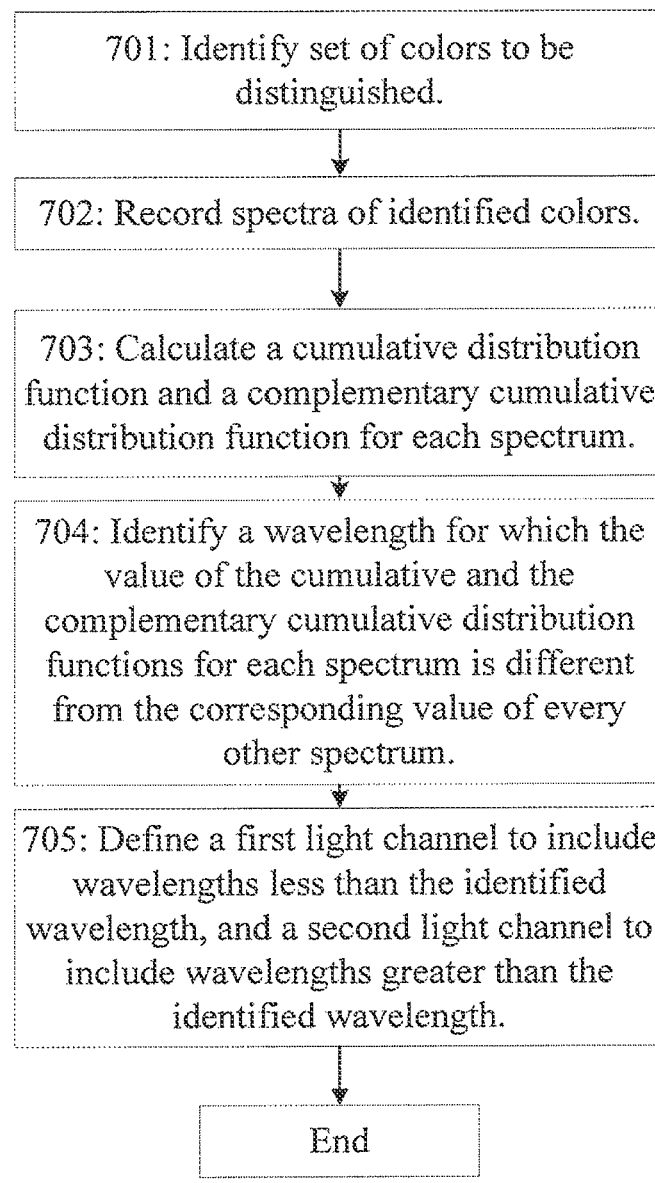
FIG. 7 is a flow chart of a process for selecting light channels for an imaging system, according to an illustrative implementation.
Figure 14:
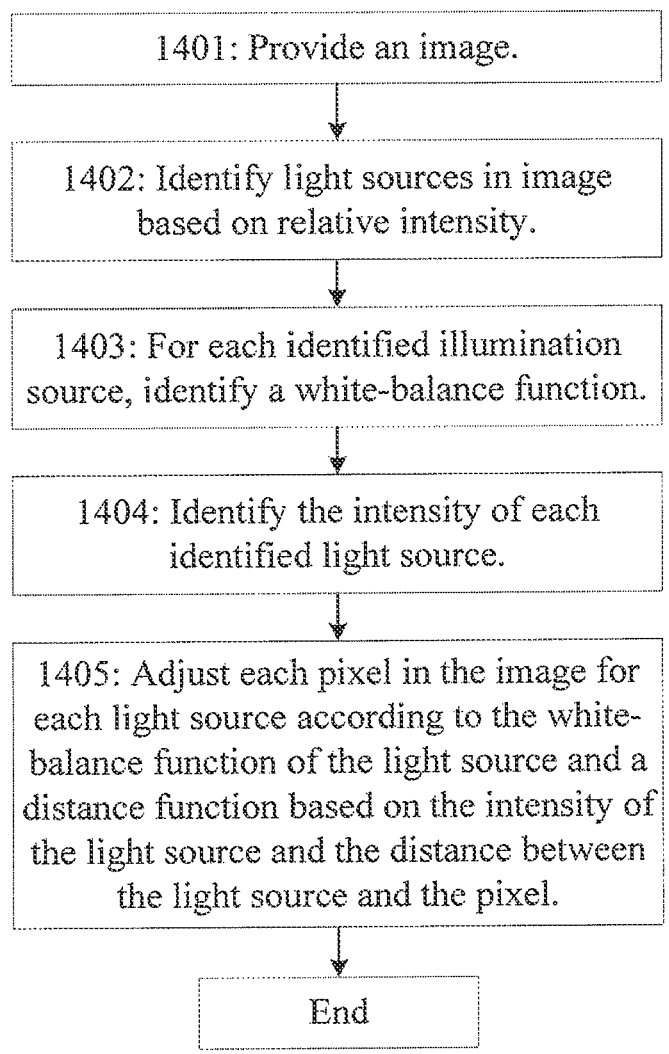
FIG. 14 is a flow chart of a process for correcting colors in an image based on illumination sources, according to an illustrative implementation.
Figure 15:
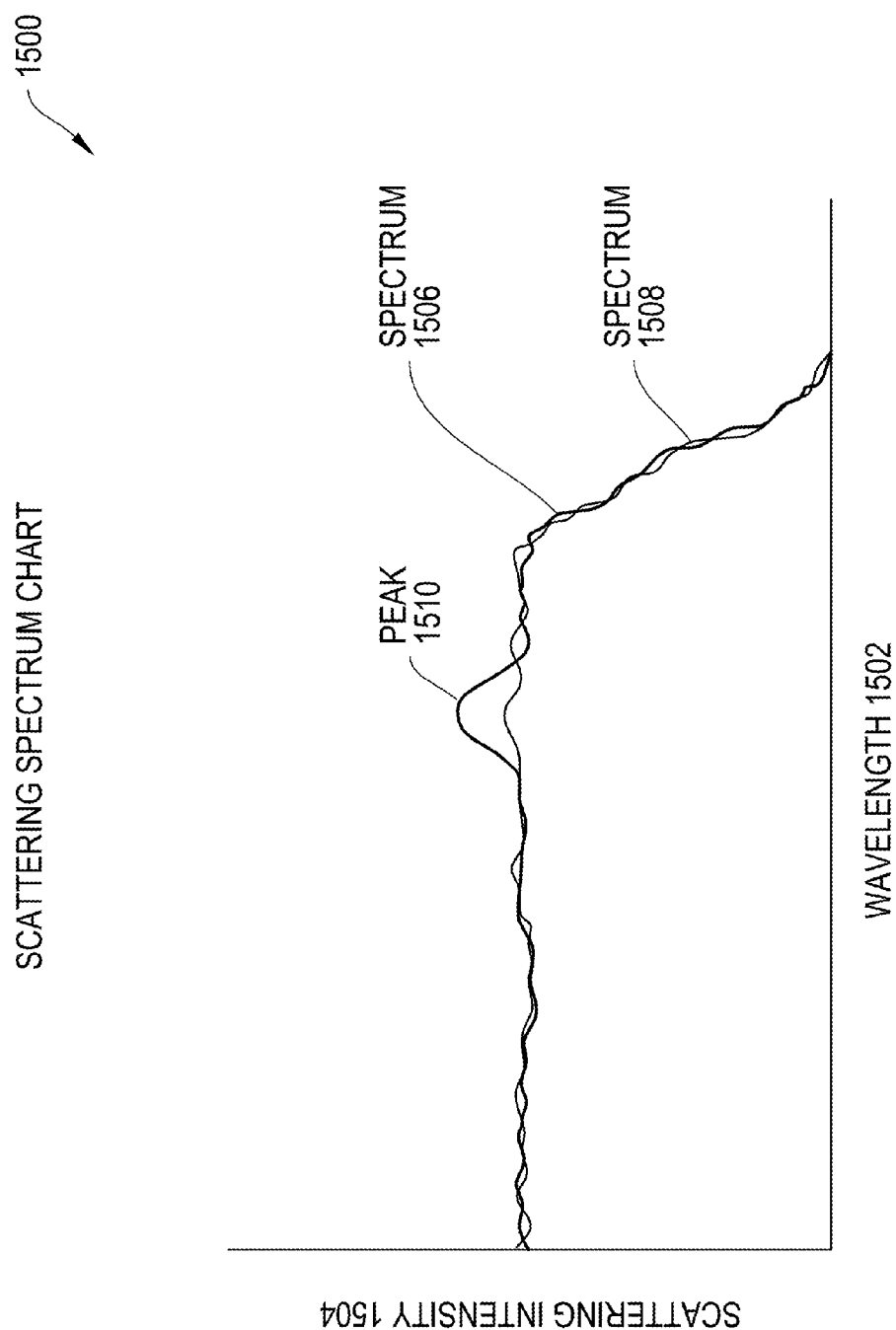
FIG. 15 is an illustrative graph depicting two colors with small distinguishing features.
Figure 16:
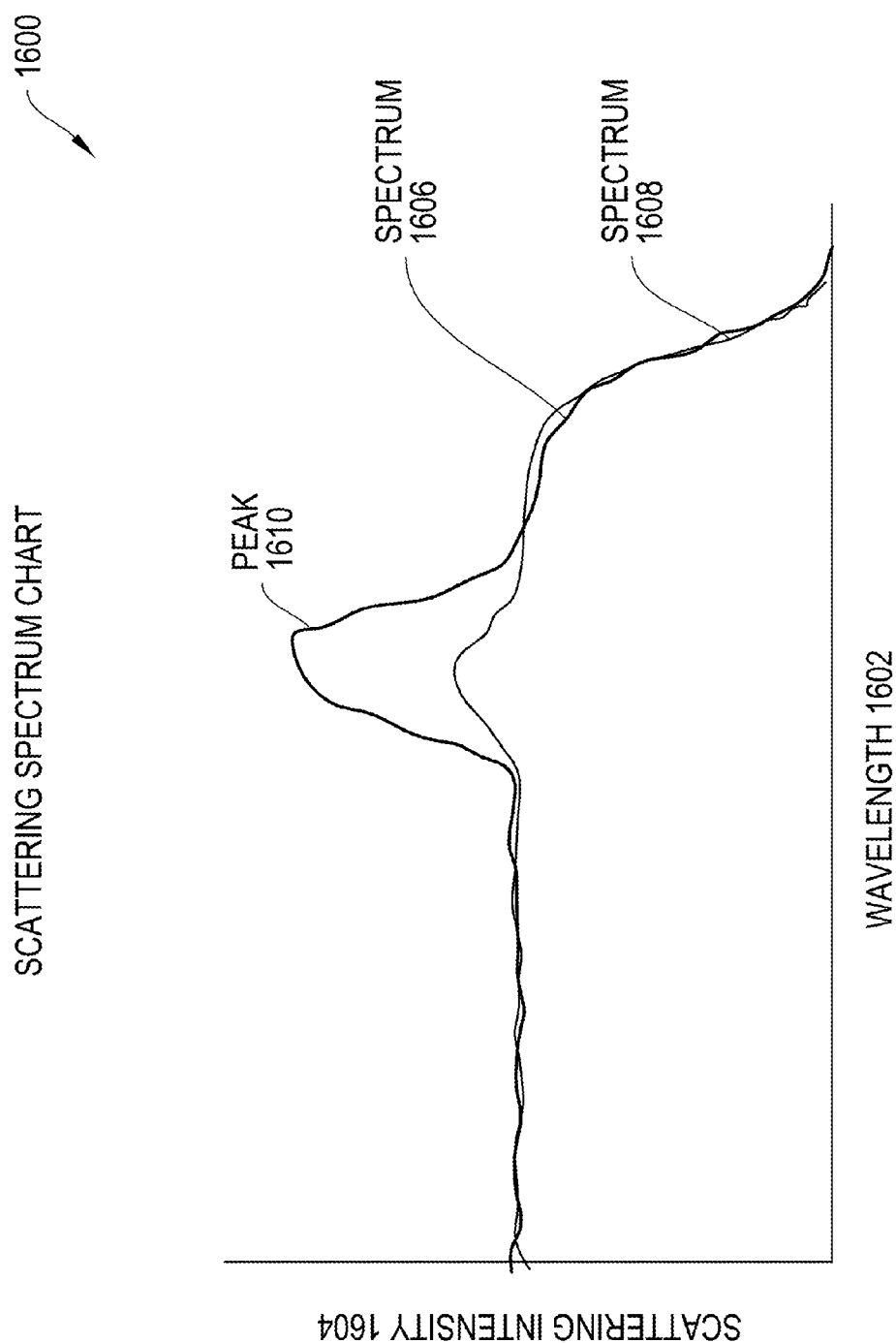
FIG. 16 is an illustrative graph depicting the two colors of FIG. 16 under differentiating illumination.
Figure 17:
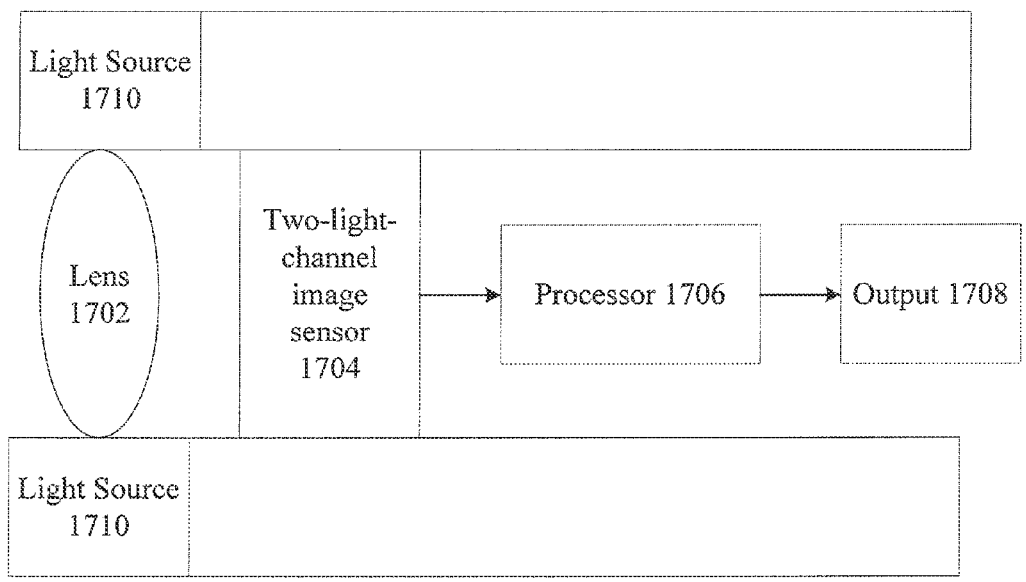
FIG. 17 is a block diagram of an endoscope using a two-light-channel sensor, according to an illustrative implementation.
Figure 18:
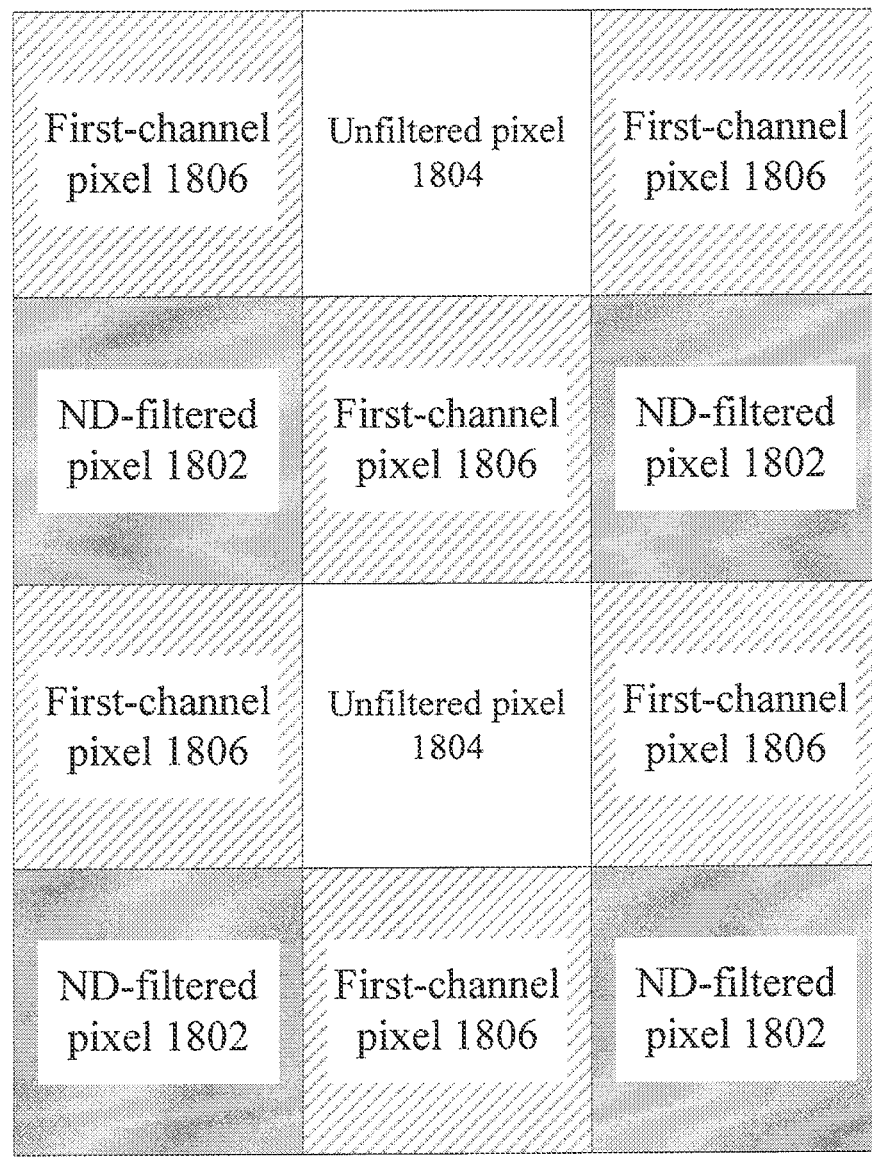
FIG. 18 is a view of a high dynamic range filter array, according to an illustrative implementation.
Figure 19:
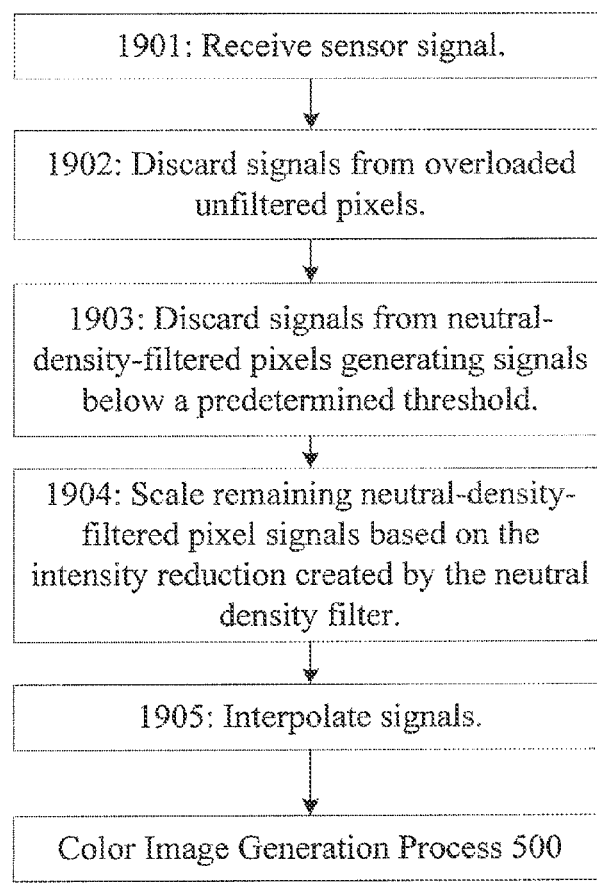
FIG. 19 is a flow chart of a process for high dynamic range imaging, according to an illustrative implementation.
Figure 20:
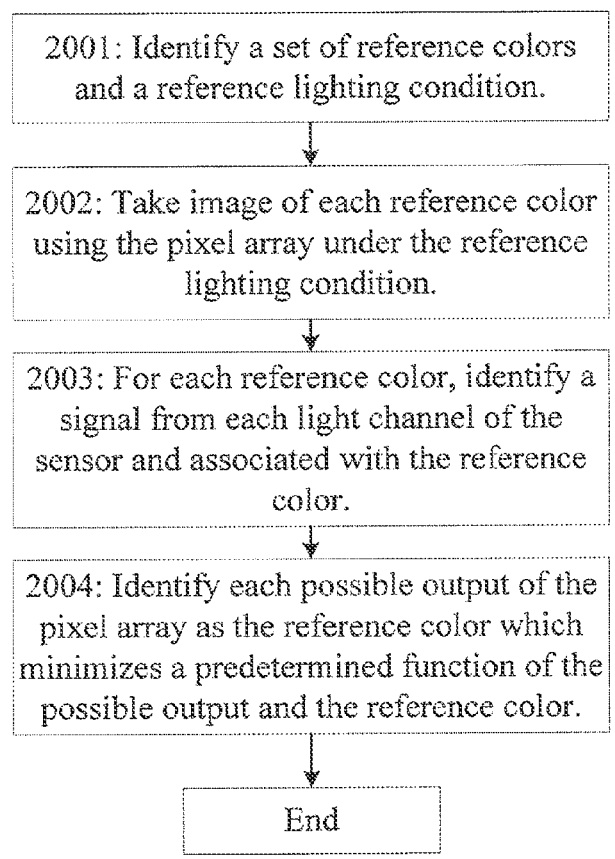
FIG. 20 is a flow chart of a process for generating a color lookup table, according to an illustrative implementation.
Figure 22:
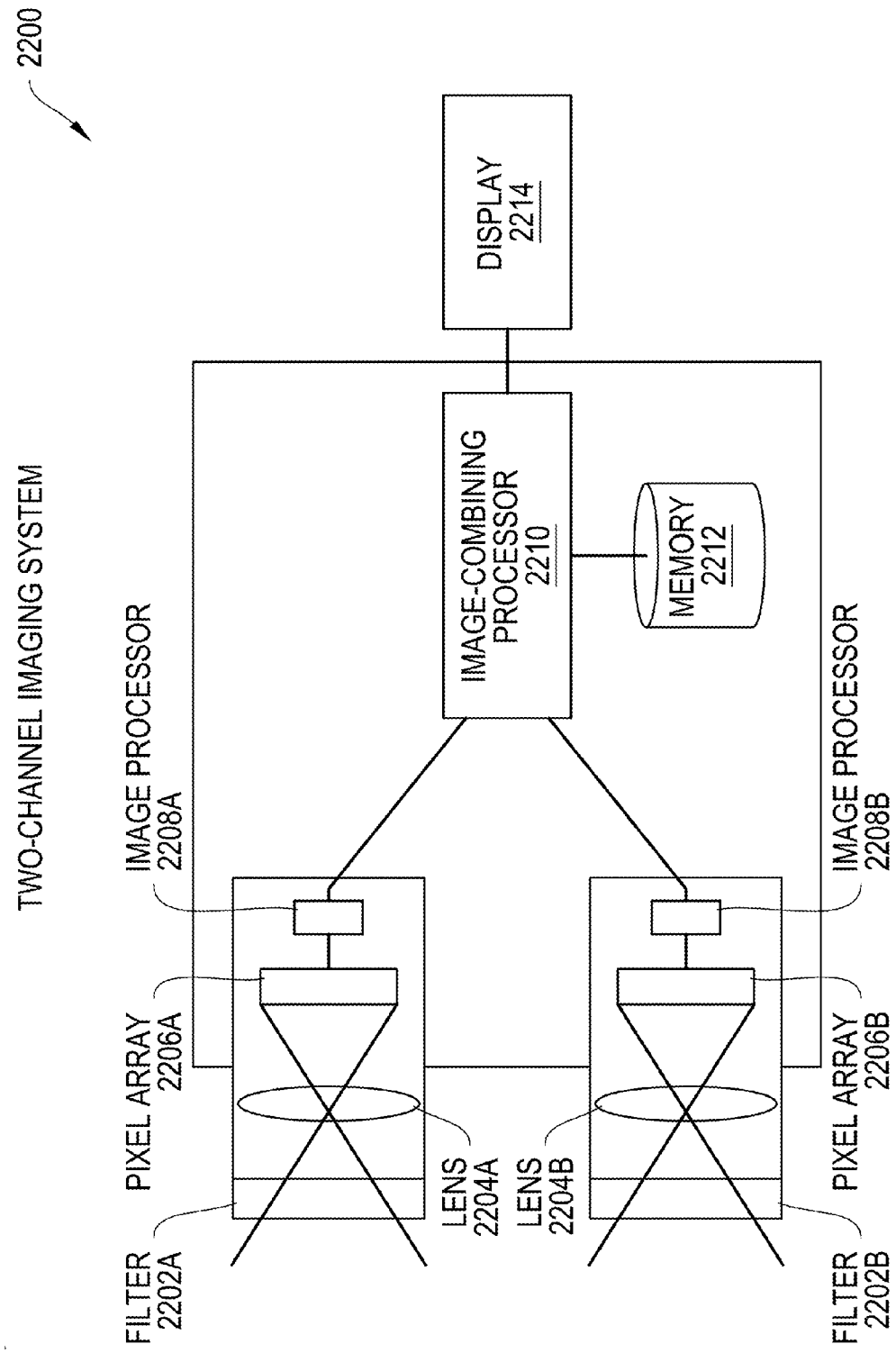
FIG. 22 is a block diagram of a digital camera using two parallel single-light-channel sensor arrays, according to an illustrative implementation.
Figure 23:
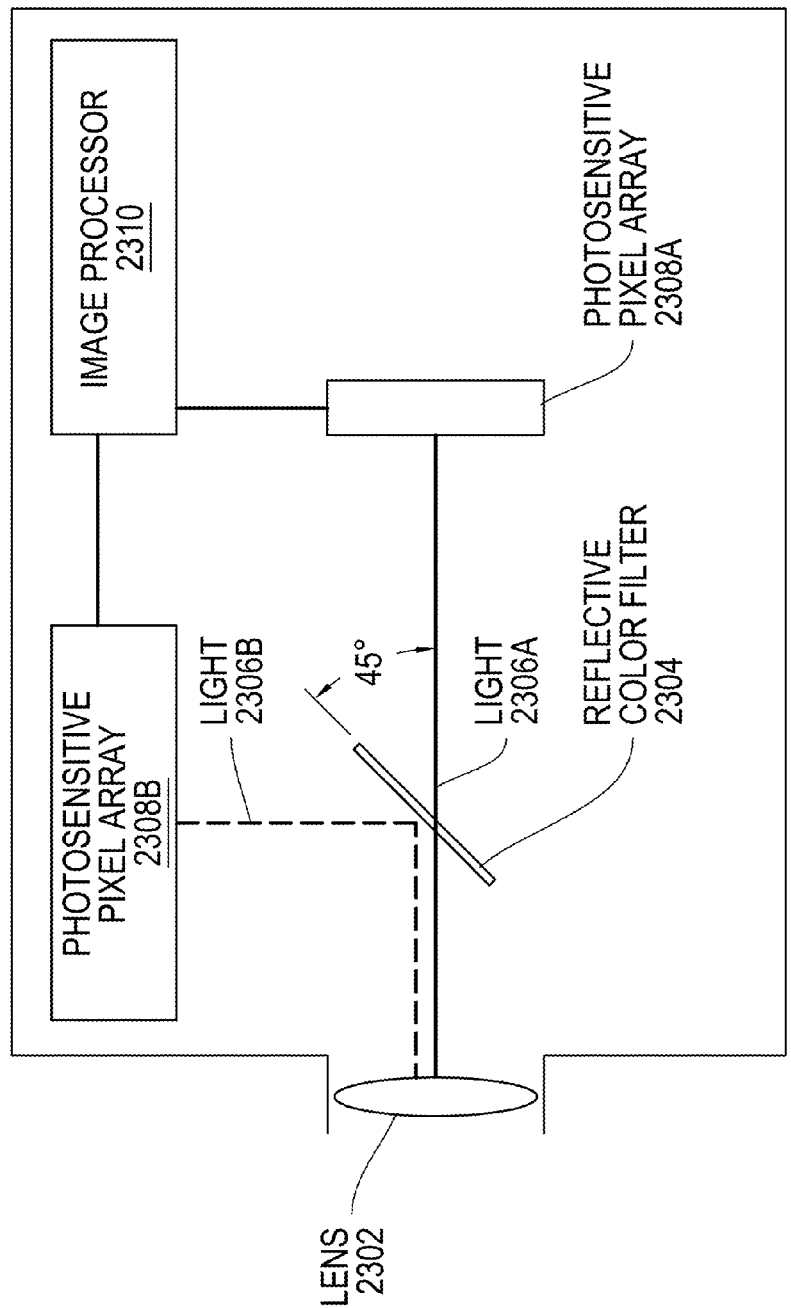
FIG. 23 is a block diagram of a digital camera using two single-light-channel sensors and a beam splitter, according to an illustrative implementation.

The systems and methods described herein relate to generating color images using an array of photosensitive pixels. FIG. 1 provides an overview of an exemplary system used to generate such images using two light channels. FIG. 2 depicts a photosensitive pixel used within such a system, while FIG. 3 depicts an array of such pixels. FIG. 4 provides an overview of the image generation process, while FIG. 5 provides an exemplary method for generating a color image. FIG. 6 is a graph illustrating how colors may be distinguished in a two-channel imaging system. FIG. 7 presents an exemplary method for selecting which light channels to use in an imaging system. FIG. 8-13 present a variety of exemplary color filter array patterns. FIG. 14 presents an exemplary white-balance method, a method for correcting recorded colors based on a source of illumination. FIG. 15 presents an illustrative graph depicting two colors with small distinguishing features, FIG. 16 illustrates the effect of differentiating illumination on the same two colors, and FIG. 17 presents an endoscope as an exemplary overview of a system combining a two-channel sensor and a differentiating illumination source. FIG. 18 illustrates a filter array that may be used for high dynamic range imaging, while FIG. 19 presents an exemplary method for high dynamic range imaging using the filter array of FIG. 18. FIG. 20 presents an exemplary method for generating a lookup table associating a digital sensor output with a reference color, and FIG. 21 applies lookup tables such as that generated by the method of FIG. 20 to automated color identification. FIGS. 22 and 23 depict multisensor two-channel imaging systems.

General System Description

FIG. 1 is an illustrative block diagram of a two-channel digital camera 100, which produces a color image of a scene using only two light channels. Camera 100 includes a lens 102 to focus light from a scene onto pixel array 104. Pixel array 104 may include only two varieties of pixels, as described in relation to FIG. 3, or may be sensitive to more than two light channels. Signals generated by pixel array 104 in response to light are amplified by amplifier 106, and converted to digital signals by analog-to-digital converter (ADC) 108. Demosaicker 110 approximates signal values for points on pixel array 104 which do not generate a signal associated with a light channel. Image processor 112 may process the signals to reduce noise, scale the image, perform color correction, or otherwise process the raw image data. Compressor 114 may compress the raw image data into an image file, which output processor 116 may save to memory 118, output to visual output 120, output to data output 122, or some combination thereof.

FIG. 2 depicts a photosensitive pixel 200, which may be an element of the photosensitive pixel array 104 depicted in FIG. 1. As depicted, pixel 200 includes a photodetector 202, a filter 204, and a microlens 206. Photodetector 202 produces an electrical signal based on incident light, and may be a CCD pixel, a CMOS pixel, an organic photodetector, or some other suitable transducer. Filter 204 is a selective wavelength filter that only allows light in a particular light channel to reach photodetector 206, and may include absorptive filters, reflective filters, or any suitable color filters. Pixel 200 will thus generate a signal based on the intensity of light that is passed by filter 204 and that photodetector 202 is sensitive to. Therefore, in certain implementations, photodetector 202 and filter 204 determine the light channel with which pixel 200 is associated. In certain implementations, a pixel 200 may not include a filter 204 or may include a filter 204 that does not selectively filter wavelengths. Such a pixel 200 will generate a signal based on the light to which photodetector 202 is sensitive, which may include a portion of visible light, all visible light, visible and infrared light, or some other light channel. Microlens 206 focuses incident light onto photodetector 202 to increase the amount of light available to the photosensitive region of the pixel 200. In certain implementations, pixel 200 may not include a microlens 206.

FIG. 3 depicts a photosensitive pixel array 300, such as the pixel array 104 depicted in FIG. 1. Pixel array 300 includes a color filter array (CFA) 302 and a photosensitive element array 304. CFA 302 is an array of filters 306A and 306B, and may be in a pattern such as those described in relation to FIGS. 8-13. Photosensitive element array 304 is an array of photodetectors 308, each of which is disposed behind a filter 306A or 306B. Each element of CFA 302 and photosensitive element array 304 thus form a photosensitive pixel, such as pixel 200 depicted in FIG. 2. Thus a photodetector 308 disposed behind a filter 306A will generate a signal indicating the intensity of light incident on the filter 306A and associated with a first light channel. Likewise, a photodetector 308 disposed behind a filter 306B will generate a signal indicating the intensity of light incident on the filter 306B and associated with a second light channel. In certain implementations, the CFA 302 includes only filter 306A and 306B arranged in any suitable pattern such that the array selectively filters light into only two light channels. In certain implementations, filters 306A or 306B may not selectively filter wavelengths of light, as described in relation to FIG. 2. Similarly, in certain implementations photosensitive element array 304 may be composed of more than one type of photodetector 308, and different types of photosensitive elements 308 may be sensitive to different light channels. In such implementations, photosensitive pixel array 300 may not include a CFA 302, and the different types of photodetectors 308 may be arranged in a pattern such as those described in relation to FIGS. 8-13. In certain implementations, photosensitive pixel array 300 may include more than two varieties of pixels.

Two-Light-Channel Imaging

FIG. 4 illustrates how light from a scene is converted to an image by a digital camera such as that described in relation to FIG. 1. Light from a scene 400 is incident on an array of pixels 402. The incident light has a spectrum 404 that may vary from between pixels 402 according to the variations in the light from the scene 400. For each pixel 402, the spectrum 404 is filtered by a CFA 406, such that each filter of CFA 406 filters out those parts of spectrum 404 which are not included in the light channel corresponding to the filter. In some implementations, a light channel may include two or more noncontiguous bands of wavelengths. In certain implementations, there may be more than two varieties of filters in CFA 406. Photodetectors 410 convert the resulting filtered spectra 408A and 408B to electrical signals 412A and 412B. In certain implementations, different photodetectors 410 may have different sensitivities to spectra, such that a photodetector 410 may generate the same signal in response to filtered spectra 408A as it would in response to spectrum 404. Such implementations may not include a CFA 406.

Signals 412A and 412B are provided to a post processor 414, which records the signals as an image 416 composed of image pixels 418. An image pixel 418 corresponds to a pixel 402, and may indicate the light channel associated with pixel 402 and the intensity of the signal generated by pixel 402. In certain implementations, post processor 414 may identify a color vector associated with each pixel 402. A color vector is an ordered set of numbers describing a color by the strength of the signal the color engenders in each of one or more light channels. As an illustrative example, a color displayed on a computer monitor may be described by the intensity of the red, green, and blue light used to generate the color. In a two-light-channel system, a color vector describing a color may represent a first-channel signal and a second-channel signal generated in response to the color. A color vector for the spectrum at a pixel 402 may be estimated by the signal generated by pixel 402 and by interpolating signals generated by one or more other pixels 402 that are sensitive to other light channels.

FIG. 5 is a flow chart representing a color image generation process 500. Referring to FIG. 1, color image generation process 500 begins with step 501, in which pixel array 104 is exposed to light from a scene, such as scene 400 of FIG. 4. As described in relation to FIG. 2, each pixel of pixel array 104 generates a signal (such as signal 412A or 412B of FIG. 4) as a function of the intensity of light incident on the pixel and the wavelengths to which the pixel is sensitive. In step 502, demosaicker 110 receives these generated signals, and in step 503 identifies a color vector for each pixel of pixel array 104. The intensity of light associated with a light channel to which a pixel is sensitive is indicated by the signal generated by the pixel. The intensity of light associated with a light channel to which a pixel is not sensitive may be estimated as a function of signals from other pixels that are sensitive to the light channel. Such a function may include nearest-neighbor interpolation, bilinear interpolation, or some other suitable demosaicing function. In certain implementations, the signals are not demosaicked, in which case a first-channel pixel is only associated with a first-channel signal, and a second-channel pixel is only associated with a second-channel signal. Step 504 identifies a starting pixel for interpretation and its associated color vector.

In step 505, image processor 112 determines whether the color vector for the pixel is listed in a color lookup table. A color lookup table records associations between color vectors and colors. Step 505 may include searching for an exact match for the color vector, searching for a match within a predetermined margin of the color vector, or searching for a match of the ratio between the elements of the color vector. In the latter case, the ratio between the elements of the color vector and the vector between the color vector and the entry in the lookup table may each provide color information, such as hue, brightness, or saturation. If the color vector is in the color table, step 506 defines the pixel as having the RGB value of the color indicated by the lookup table; otherwise, in step 507, image processor 112 translates the signals into an RGB value. Image processor 112 may translate the signals of a two-channel system into an RGB image by a predetermined formula based on the definitions of the two channels, by assigning the output of a first channel to a monitor's red output and the output of the second channel to the green and blue outputs, or some other suitable method. One illustrative example of a possible set of equations for translating signals from a two-channel imaging system into RGB values is:

$$red=255*(0.19+0.84*channel\text{-}1+0.36*channel\text{-}2); \quad (1)$$

$$green=255*(0.17+0.91*channel\text{-}1+0.17*channel\text{-}2); \quad (2)$$

$$blue=255*(0.25+0.73*channel\text{-}1-0.48*channel\text{-}2), \quad (3)$$

In particular, the left-hand side of Equations 1, 2, and 3 respectively represent the red, green, and blue values used to generate output on a standard computer monitor. On the right-hand sides of Equations 1-3, "channel-1" represents the signal associated with the first channel and "channel-2" represents the signal associated with the second channel. Equations 1-3 are only example equations, and other equations may be applied or used to transform a two-channel output into an RGB or other output. Other equations may similarly be applied or used to transform outputs with more than two channels into two-channel, RGB, or other suitable outputs. In certain implementations, steps 506 and 507 may translate the two channel signals into a color space other than the RGB color space, such as the cyan-magenta-yellow-key (CMYK) color space or the hue-saturation-value (HSV) color space. Regardless of whether step 506 or 507 followed step 505, step 508 determines whether unconverted pixels remain.

If an unconverted pixel remains, step 509 identifies a next pixel for conversion, which may occur using a left-to-right, top-to-bottom pattern or any other suitable method for identifying an unconverted pixel, and color image generation process 500 returns to step 505. If no unconverted pixel remains, the process is complete. In certain implementations, the two channel signals are not translated at all, in which case steps 504 through 509 may be skipped. In certain implementations, color image generation process may be applied to a system with more than two light channels.

FIG. 6 is a color comparison chart 600 showing the signals generated in a first and a second light channel by the colors 602A-X (collectively, colors 602) of the COLOR-CHECKER® Classic Color Rendition Chart. Each color 602 is represented by a dot on color comparison chart 600. The position of a color 602 along the light channel signal axis 604 represents the signal generated by the color 602 in a pixel associated with a first color channel, while the position of a color 602 along the light channel signal axis 606 represents the signal generated by the color 602 in a pixel associated with a second color channel. Line 608 is drawn between shades of gray as a guide to the eye, with the shades becoming lighter as the line moves towards the top right corner of color comparison chart 600. So long as an imaging system does not generate the same response in all of its color channels to two different colors, the two colors may be distinguished by the system. As described in detail in relation to FIG. 7, the color channels of an imaging system may therefore be selected based on a set of colors the imaging system is meant to distinguish.

Light Channel Selection

FIG. 7 is a flow chart representing a light channel selection process 700 to identify light channels for a two-light-channel imaging system. Step 701 identifies a set of colors to be distinguished by the imaging system. The set of colors may include at least one of a set of primary colors, natural colors, and artificial colors. As an illustrative example, an imaging system used in a surveillance setting may be designed to distinguish between red, green, and blue cars, while an imaging system used in a medical setting may be designed to distinguish between healthy tissue and diseased tissue. Step 702 records the spectra associated with the identified colors, indicating the intensity of light associated with each color for each wavelength within a range of wavelengths. The range of wavelengths may include a portion of visible light, all visible light, infrared light, visible and infrared light, or some other suitable combination of wavelengths. In certain implementations, the spectra may be multiplied at each wavelength by the sensitivity of a detector at that wavelength. As an illustrative example, if the imaging system will use CMOS pixels which generate a stronger signal in response to light with a 450 nm wavelength than light with a 680 nm wavelength, the intensity of the spectrum at 680 nm may be reduced relative to the intensity at 450 nm to reflect the smaller contribution of the 680 nm light to the signal generated by the CMOS pixels.

Step 703 calculates a cumulative distribution function and a complementary distribution function for each identified spectrum. A pixel associated with a light channel including all wavelengths up to and including a particular wavelength would respond to a reference color with a signal that is a function of the cumulative distribution function of the reference color spectrum at the particular wavelength. Similarly, a pixel associated with a light channel including all wavelengths greater than or equal to a particular wavelength would respond to a reference color with a signal that is a function of the complementary cumulative distribution function of the reference color spectrum at the particular wavelength. Therefore, step 704 identifies a wavelength at which no color of the set of colors to be distinguished will share both a value of the cumulative distribution function and a value of the complementary cumulative distribution function. Step 705 defines a first light channel to include wavelengths less than the identified wavelength, and a second light channel to include wavelengths greater than the identified wavelength. In certain implementations, step 705 may define a channel by choosing a filter from a set of predetermined filters on the basis of which filter most exactly filters out wavelengths above or below the identified wavelength. In certain implementations, pixels created to generate signals associated with the identified light channels are tested to determine that the colors are distinguished as intended, and if they are not process 700 returns to step 704 and identifies an alternate wavelength.

In certain implementations, light channel selection process 700 may be applied to identify n light channels, where n is an integer greater than two. In such implementations, process 700 may identify a set of n−1 wavelengths for each spectrum recorded in step 702 such that the cumulative distribution function at the first identified wavelength is 1/n of the cumulative distribution function at the end of the spectrum, and that each further identified wavelength represents an additional 1/n of the cumulative distribution function at the end of the spectrum. Process 700 may further take the median of each identified point for each of the recorded spectra, and assign light channels based on such medians. In such an implementation, if the resulting light channels do not distinguish between each color in the set of colors to be distinguished, the process may further identify the two contiguous light channels with the greatest number of colors having an identical response to each of the contiguous light channels, and redefine the light channels such that their boundary is located halfway between the current wavelength and the next closest identified wavelength for a color.

In certain implementations, light channels may be selected such that each is equally sensitive to nonvisible light, such as infrared light. Such implementations may increase the light available to generate a signal while still allowing distinctions between visible colors.

Pixel Array Patterns

Figure 8:
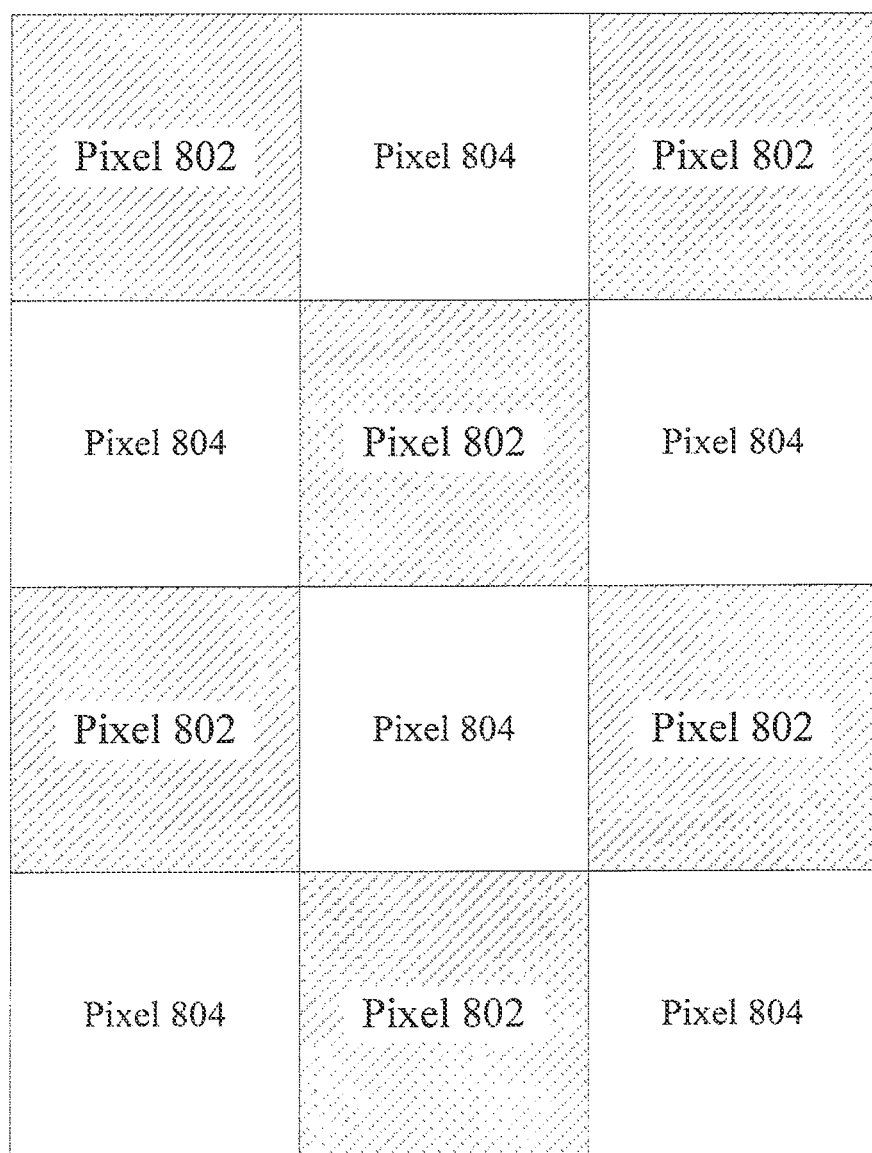

FIGS. 8-13 represent a variety of possible pixel patterns for a two-light-channel photosensitive pixel array such as that depicted in FIG. 3. As depicted, each pixel pattern includes two types of pixels, with a first type associated with a first light channel and a second type associated with a second light channel. FIG. 8 depicts a pixel pattern 800 consisting of a checkerboard pattern of pixels 802 and 804. FIG. 9 depicts a pixel pattern 900 consisting of a pattern of diagonal stripes, with two rows of pixels 902 for every row of pixels 904. FIG. 10 depicts a pixel pattern 1000 in which two pixels 1002 are placed on a diagonal line and two off of the diagonal line, with pixels 1004 filling in the rest of the pattern. FIG. 11 depicts a pixel pattern 1100 partly comprised of a checkerboard pattern and partly composed of an occasional pixel 1102 interspersed among a number of pixels 1104. FIG. 12 depicts a pixel pattern 1200 half-comprised of horizontal rows of pixels 1204, with the other half comprised of two horizontal rows, one comprised mainly of pixels 1202, the other comprised mainly of pixels 1204, and each row mirroring the other. FIG. 13 depicts a pixel pattern 1300 comprising a square of pixels 1302 pixels surrounded by a border of pixels 1304. The patterns depicted in FIGS. 8-13 are not an exhaustive collection of the possible two-light-channel pixel array patterns, but are meant to demonstrate the wide range of possible patterns. Accordingly, patterns for a two-channel pixel array may be selected as desired and in any combination and arrangement without departing from the scope of the systems and methods described herein.

In FIGS. 8-13, and as described in relation to FIGS. 2 and 3, pixels may be associated with a light channel by the sensitivity of a photodetector, by a color filter placed in front of the photodetector, or by some other suitable method. In certain implementations, both sets of pixels use the same photodetectors, but one set includes a color filter. In such implementations, the color filters may define a first light channel, and a signal associated with the first channel may be subtracted from a signal associated with an unfiltered pixel to generate a signal corresponding to those parts of the spectrum not included in the first light channel.

Local White Balance

FIG. 14 is a flow chart representing local white balance process 1400. Different light sources may generate different spectra, which in turn may affect the appearance of colors by changing the wavelengths of light available to scatter. As such, scaling colors in an image based on the illumination source of the image may improve the accuracy of color reproduction. Referring to FIG. 1, in step 1401 an image is provided to output processor 116. In step 1402, output processor 116 identifies light sources in the image based on their intensity, such as by identifying regions of the image with signals stronger than a predetermined threshold, identifying regions of the image with signals stronger than other areas of the image, or by some other suitable identifying feature. Output processor 116 identifies a white-balance function for each light source in step 1403, such as by identifying a constant by which to multiple one or more light channel signals to meet an assumption that a light source appear to be white, by identifying the light source as matching one of a set of predetermined light source profiles with preestablished white balance functions, or by some other suitable method for establishing a white-balance function. Output processor 116 further identifies the intensity of each identified light source in step 1404. In certain implementations, the user may provide information regarding a light source, such as by selecting a light source within an image, by indicating a type, intensity, and location of a light source not pictured in the image, by taking a separate image of a light source and indicating its position relative to the photographer and scene, or by some other method of providing light source information.

Finally, in step 1405, output processor 116 adjusts each pixel in the image according to the identified light sources. The signals associated with each pixel are scaled based on both the identified white-balance function for each light source and a function of the distance between the light source and the pixel being adjusted. The function of the distance may be a Gaussian function, a cubic function, or some other suitable function to describe the extent to which a light source will influence a color at a distance. The distance may be measured by the number of pixels between the light source and the pixel being adjusted, by a calculation based on the intensity of light associated with the light source and the intensity of light associated with the pixel, by distance data provided by the user, generated through an autofocus system, or inferred from the image, or by some other suitable method for identifying a distance between the light source and a location in the image.

Selective Illumination for Color Differentiation

FIGS. 15 and 16 illustrate how different illumination sources can clarify the differences between colors. In FIG. 15, scattering spectrum chart 1500 presents wavelength 1502 along the x-axis and scattering intensity 1504 along the y-axis. Spectrum 1506 has a small peak 1510 which distinguishes it from spectrum 1508, but as the difference is small an imaging system may not reliably distinguish the two spectra. But illumination designed to heighten peak 1510 may change the situation to resemble that depicted in FIG. 16. In scattering spectrum chart 1600, wavelength 1602 is presented along the x-axis and scattering intensity 1604 along the y-axis. Spectrum 1606 corresponds to spectrum 1506, but with additional illumination to heighten peak 1610 as shown, heightening the distinction between spectra 1606 and 1608.

FIG. 17 is a block diagram of an endoscope 1700. Endocope 1700 includes a lens 1702 to focus a scene onto a two-channel image sensor 1704 like pixel array 104 of FIG. 1. Two-channel image sensor 1704 generates electrical signals based on incident light from the scene, which processor 1706 converts to an image as described in relation to FIG. 5. The image generated is transmitted to output 1708, which may include a display, a computer memory, or some other suitable image output. Endoscope 1700 may also include a light source 1710, which may serve to highlight a spectral difference between healthy and diseased tissue as depicted in FIGS. 15 and 16.

High Dynamic Range (HDR) Imaging

FIG. 18 depicts a photosensitive pixel array 1800, similar to the pixel array 104 depicted in FIG. 1. Pixel array 1800 is designed to capture details of a scene containing both bright and dark elements in a single photograph. Rather than combining a short- and a long-exposure photograph of a scene, risking blur caused by an element of the scene moving before the second image is captured, pixel array 1800 uses neutral density (ND) filters to effectively capture a short- and a long-exposure image at the same time. Neutral density (ND) filters evenly filter the full visible spectrum of light, and in some implementations may evenly filter other wavelength bands as well. Thus, an ND-filtered pixel 1802 can record light intensities that would overload an unfiltered pixel 1804 without affecting color determinations. At the same time, unfiltered pixels 1804 maintain a sensitivity to light intensities that would be below a response threshold for ND-filtered pixels 1802. In certain implementations, an ND-filtered pixel 1802 may not include an ND filter, but rather a photodetector which generates an electrical signal which is weaker than but uniformly proportional to the response of an unfiltered pixel 1804 at every wavelength. Pixel array 1800 also includes first-channel pixels 1806, which may be used in conjunction with the ND-filtered pixels 1802 and the unfiltered pixels 1804 to identify colors as described in relation to FIGS. 8-13. In certain implementations, the light channel represented by ND-filtered pixels 1802 and unfiltered pixels 1804 may not include every wavelength included in the light channel associated with first-channel pixels 1806. In certain implementations, pixel array 1800 may feature a different pattern of pixels, whether in relation to the pattern of elements with color filters and elements without, as depicted in FIGS. 8-13, or in relation between elements with and without a ND filter. In certain implementations, pixel array 1800 may include more than two light channels.

FIG. 19 is a flow chart representing a high dynamic range imaging process 1900. Referring to FIGS. 1 and 18, the process begins when demosaicker 110 receives a signal from a photosensitive pixel array 1800. In step 1902, demosaicker 110 discards signals from unfiltered pixels 1804 that indicate an overload, as the light intensity at such pixels was too great to accurately record. Similarly, in step 1903, demosaicker 110 discards signals that are below a predetermined threshold and generated by ND-filtered pixels 1802, as the light intensity at such pixels was too low to be accurately recorded. Then, in step 1904, demosaicker 110 scales the signals from ND-filtered pixels 1802 based on the ND filter applied: if an ND-filtered pixel 1802 produces the same signal as an unfiltered pixel 1804, the intensity of light at the ND-filtered pixel 1802 must be proportionally greater than the intensity of light at the unfiltered pixel 1804. In step 1905, demosaicker 110 determines a signal for both the first and the second channel for each pixel of pixel array 1800. As described in relation to FIG. 5, a signal generated by a pixel is used when possible, and a signal is estimated based on the signal from surrounding pixels when not, including a signal for both channels in cases where the signal from a pixel was discarded. Once signals for both channels have been identified for each pixel of pixel array 1800, a color image may be generated using color image generation process 500. In certain implementations, HDR imaging process 1900 may be applied to cases where there are more than two light channels.

Machine Color Vision

FIG. 20 is a flow chart representing a color lookup table generation process 2000. Process 2000 identifies the signals a photosensitive pixel array, such as that depicted in FIGS. 1 and 3, will generate in response to each color in a set of reference colors. Process 2000 thereby enables automatic color recognition as described in relation to FIG. 21. Process 2000 begins with step 2001, in which a set of reference colors and a reference lighting condition are identified. The lookup table generated in process 2000 will define any output of the associated pixel array as one or another of the set of reference colors. As indicated by FIGS. 14-16, the signals generated in response to a color may be affected by the lighting conditions under which the color is presented. Step 2002 takes an image of each reference color using the pixel array under the reference lighting condition. Then, for each reference color, step 2003 identifies a signal from each light channel of the pixel array associated with the reference color. Step 2003 thereby identifies an exact relationship between an output of the pixel array and a reference color. Step 2004 extends the association and completes the lookup table by identifying each possible output of the pixel array as the reference color minimizing a predetermined function of the possible output and the reference color. As an illustrative example, an output of the pixel array as graphed on a color comparison chart such as that depicted in FIG. 6 may be associated with whichever reference color it is closest to as measured on the color comparison chart. In certain implementations, multiple lookup tables may be identified for multiple lighting conditions.

Figure 21:
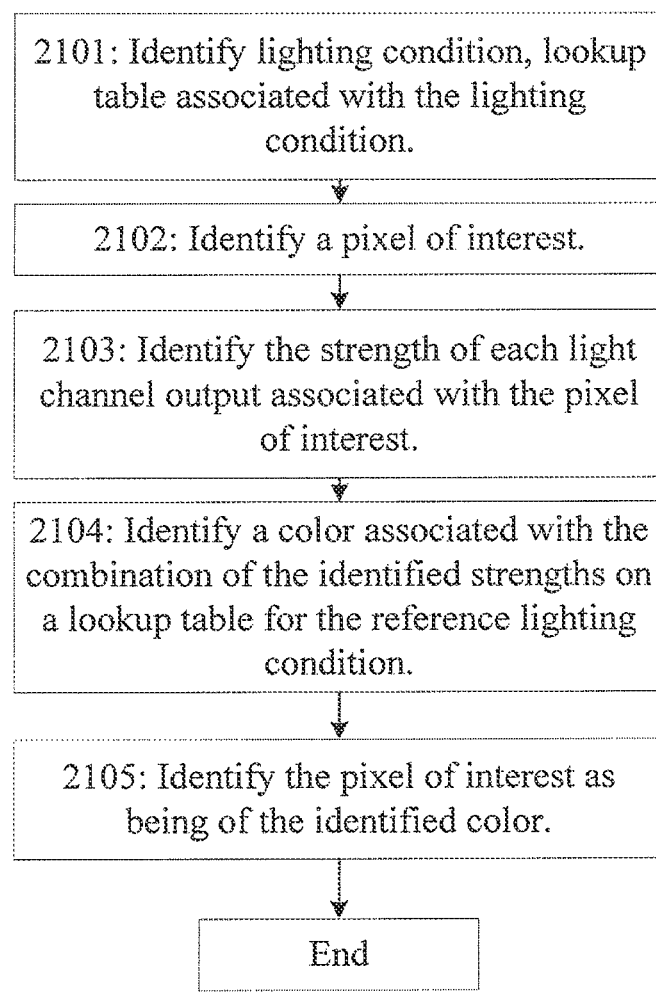
FIG. 21 is a flow chart of a process for automatic color identification, according to an illustrative implementation.

FIG. 21 is a flow chart depicting a machine color vision process 2100, an automated process for identifying a color in an image. As described in relation to FIG. 20, the lighting conditions in a scene may affect the output of an image taken of the scene. Process 2100 therefore begins with identifying a lighting condition of an image being processed and a lookup table associated with the lighting condition. The lighting condition may be identified by the user, by identifying the white balance of an illumination source as described in relation to FIG. 14, or by some other suitable method for identifying the lighting condition. In certain implementations, step 2101 may adjust the white balance of the image using a method such as local white balance process 1400, and identify a lookup table associated with a white-balanced image.

Step 2102 identifies a pixel of interest, whether by receiving a user selection, by pre-identification of a region of interest, by an automated process such as pattern recognition, or by some other suitable criteria for identifying a color to be identified. In some implementations, a region of interest may be identified rather than a single pixel. Step 2103 identifies the strength of each light channel output associated with the pixel of interest, and thereby identifies a color vector associated with the pixel of interest. Step 2104 compares the color vector with a lookup table, such as that generated by process 2000, to identify the reference color that the color vector is associated with. In certain implementations, a lookup table may indicate that a relationship between a color vector and a reference color is context-dependent, which may include cases where a color vector is equidistant between two reference colors on a color comparison chart such as that depicted in FIG. 6. In such implementations, the lookup table may indicate the contextual information required to identify the color, which may include the color of surrounding pixels or regions, the sharpness of the region in which the pixel lies, or other suitable information. Once the color vector is associated with a single reference color, step 2105 identifies the pixel of interest as being of the identified color and process 2100 is complete. In certain implementations, process 2100 may be applied to multiple pixels or regions, simultaneously or sequentially.

Alternative Imaging Devices

FIG. 22 is a block diagram of an alternative two-channel imaging system 2200. Light from a scene is filtered by filters 2202A and 2202B, corresponding to a first and a second light channel respectively. Lenses 2204A and 2204B focus incident light from a scene onto photosensitive pixel arrays 2206A and 2206B, which may be uniform arrays of photosensitive pixels, may include a pattern of ND and unfiltered pixels for HDR imaging as described in relation to FIG. 19, or be some other suitable photosensitive pixel arrays. Image processor 2208A translates signals from photosensitive pixel array 2206A into an image associated with a first light channel, while image processor 2208B translates signals from photosensitive pixel array 2206B into an image associated with a second light channel. The two images are combined into a single image by image-combining processor 2210, and may be stored in memory 2212, output to display 2214, or otherwise output.

FIG. 23 is a block diagram of an alternative two-channel imaging system 2300. Light from a scene is focused by a lens 2302. The focused light falls on a reflective color filter 2304, which transmits light 2306A that is associated with a first light channel to photosensitive pixel array 2308A and reflects light 2306B that is associated with a second channel to photosensitive pixel array 2308B. Pixel arrays 2308A and 2308B may be uniform arrays of photosensitive pixels, may include a pattern of ND and unfiltered pixels for HDR imaging as described in relation to FIG. 19, or be some other suitable photosensitive pixel arrays. Image processor 2310 may combine signals from corresponding pixels on the pixel arrays 2308A and 2308B to generate a color image as described in relation to FIG. 5 without requiring interpolation.

Software and Hardware

As noted above, the sensors described with reference to the systems and methods described herein can be of any suitable type and may include CCD imaging sensors, CMOS imaging sensors, or any analog or digital imaging sensor. The sensors may be responsive to electromagnetic radiation outside the visible spectrum, and may include thermal, gamma, multi-spectral and x-ray sensors. The sensors, in combination with other components in the imaging system, may generate a file in any format, such as the raw data, GIF, JPEG, TIFF, PBM, PGM, PPM, EPSF, X11 bitmap, Utah Raster Toolkit RLE, PDS/VICAR, Sun Rasterfile, BMP, PCX, PNG, IRIS RGB, XPM, Targa, XWD, PostScript, and PM formats on workstations and terminals running the X11 Window System or any image file suitable for import into the data processing system. Additionally, the system may be employed for generating video images, including digital video images in the .AVI, .WMV, .MOV, .RAM and .MPG formats.

The systems and methods described herein may be implemented in an image processor which may include microcontrollers and microprocessors programmed to receive 2-channel data from the image sensor pixels and convert the data into an RGB value for display on a monitor. The image processors may be configured with hardware and software to perform one or more of the methods, and any combination of the one or more methods, described herein. In particular, the image processor may include a central processing unit (CPU), a memory, and an interconnect bus (not shown). The CPU may include a single microprocessor or a plurality of microprocessors for configuring the image processor as a multi-processor system. The memory may include a main memory and a read-only memory. The image processor also includes mass storage devices having, for example, various disk drives, tape drives, FLASH drives, etc. The main memory also includes dynamic random access memory (DRAM) and high-speed cache memory. In operation, the main memory stores at least portions of instructions and data for execution by a CPU.

The systems and methods may include a mass storage, which may include one or more magnetic disk or tape drives or optical disk drives, for storing data and instructions for use by the image processor. At least one component of the mass storage system, possibly in the form of a disk drive or tape drive, stores the database used for processing the signals measured from the image sensors. The mass storage system may also include one or more drives for various portable media, such as a floppy disk, a compact disc read-only memory (CD-ROM), DVD, or an integrated circuit non-volatile memory adapter (i.e. PC-MCIA adapter) to input and output data and code to and from the image processor.

The image processor may also include one or more input/output interfaces for data communications. The data interface may be a modem, a network card, serial port, bus adapter, or any other suitable data communications mechanism for communicating with one or more local or remote systems. The data interface may provide a relatively high-speed link to a network, such as the Internet. The communication link to the network may be, for example, optical, wired, or wireless (e.g., via satellite or cellular network). Alternatively, the image processor may include a mainframe or other type of host computer system capable of communications via the network.

The image processor may also include suitable input/output ports or use the interconnect bus for interconnection with other components, a local display, and keyboard or other local user interface for programming and/or data retrieval purposes.

In certain implementations, the image processor includes circuitry for an analog-to-digital converter and/or a digital-to-analog converter. In such implementations, the analog-to-digital converter circuitry converts analog signals received at the sensors to digital signals for further processing by the image processor.

Certain components of the image processor are those typically found in imaging systems used for portable use as well as fixed use. In certain implementations, the image processor includes general purpose computer systems used as servers, workstations, personal computers, network terminals, and the like. Certain aspects of the systems and methods described herein may relate to the software elements, such as the executable code and database for the server functions of the image processor.

Generally, the methods and techniques described herein may be executed on a conventional data processing platform such as an IBM PC-compatible computer running the Windows operating systems, a SUN workstation running a UNIX operating system or another equivalent personal computer or workstation. Alternatively, the data processing system may comprise a dedicated processing system that includes an embedded programmable data processing unit.

Certain implementations of the systems and processes described herein may also be realized as software component operating on a conventional data processing system such as a UNIX workstation. In such implementations, the processes may be implemented as a computer program written in any of several languages well-known to those of ordinary skill in the art, such as (but not limited to) C, C++, FORTRAN, Java or BASIC. The processes may also be executed on commonly available clusters of processors, such as Western Scientific Linux clusters, which may allow parallel execution of all or some of the steps in the process.

Certain implementations of the methods described herein may be performed in either hardware, software, or any combination thereof, as those terms are currently known in the art. In particular, these methods may be carried out by software, firmware, or microcode operating on a computer or computers of any type, including pre-existing or already-installed image processing facilities capable of supporting any or all of the processor's functions. Additionally, software embodying these methods may comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Furthermore, such software may also be in the form of a computer data signal embodied in a carrier wave, such as that found within the well-known Web pages transferred among devices connected to the Internet. Accordingly, these methods and systems are not limited to any particular platform, unless specifically stated otherwise in the present disclosure.

The systems described herein may include additional electronic, electrical and optical hardware and software elements for capturing images without departing from the scope of the systems and methods described herein. For example, the system may include single-shot systems, which in turn, may include one or more color filters coupled with the imaging sensors (e.g., CCD or CMOS). In another implementation, the system includes multi-shot systems in which the sensor may be exposed to light from a scene in a sequence of three or more openings of the lens aperture. In such implementations, one or more imaging sensors may be combined with one or more filters passed in front of the sensor in sequence to obtain the additive color information. In other implementations, the systems described herein may be combined with computer systems for operating the lenses and/or sensors and processing captured images.

Alternative Implementations

Those skilled in the art will know or be able to ascertain using no more than routine experimentation, many equivalents to the implementations and practices described herein. Variations, modifications, and other implementations of what is described may be employed without departing from the spirit and scope of the present disclosure. More specifically, any of the method, system and device features described above or incorporated by reference may be combined with any other suitable method, system or device features disclosed herein or incorporated by reference, and is within the scope of the present disclosure. As an illustrative example, local white balance process 1400 may be applied to a system with more than two light channels, including an RGB system. The systems and methods may be embodied in other specific forms without departing from the spirit or essential characteristics thereof. The foregoing implementations are therefore to be considered in all respects illustrative, rather than limiting of the present disclosure. The teachings of all references cited herein are hereby incorporated by reference in their entirety.

We claim:

1. A low-light color imaging system, comprising:
   a first photosensitive sensor configured to generate, in response to incident light from a scene, a first set of electrical signals indicative of a first light channel including a first spectrum of wavelengths of light, wherein the first photosensitive sensor includes a first array of photosensitive pixels that are enabled to detect the first spectrum of wavelengths of light;
   a second photosensitive sensor configured to generate, in response to incident light from the scene, a second set of electrical signals indicative of a second light channel including a second spectrum of wavelengths of light, wherein the second photosensitive sensor includes a second array of photosensitive pixels that are enabled to detect the second spectrum of wavelengths of light, and wherein the second spectrum of wavelengths of light comprises a different spectrum of wavelengths of light than the first spectrum; and
   an image-combining processor connected to the first and second photosensitive sensors and having circuitry configured to:
      receive the first set of electrical signals indicative of the first light channel and the second set of electrical signals indicative of the second light channel;
      generate a full-color image of the scene based on the first and second sets of electrical signals by combining the first and second sets of electrical signals into a set of color vectors, wherein a color vector comprises an ordered set of numbers describing a color;
      translate the set of color vectors into colors in a color space with at least one of using a color lookup table that records associations between color vectors and colors, or using predetermined formulas based on definitions of the first and second light channels, and wherein using the color lookup table comprises at least one of:
         search for a color vector in the color lookup table that matches a color vector in the set of color vectors;
         search for a color vector in the color lookup table that matches a color vector in the set of color vectors within a predetermined margin; or
         search for a color vector in the color lookup table with a ratio of elements that matches a ratio of elements of a color vector in the set of color vectors; and display the full-color image.

2. The system of claim 1, wherein the first array of photosensitive pixels and the second array of photosensitive pixels comprise at least one of an array of complementary metal oxide semiconductor (CMOS) pixels, an array of charge-coupled device (CCD) pixels, or an array of organic photodetectors.

3. The system of claim 1, wherein the first photosensitive sensor comprises a first filter for filtering out light other than light in the first light channel to prevent the light other than the light in the first light channel from reaching the first photosensitive sensor.

4. The system of claim 3, wherein the first filter filters out a portion of visible light and does not filter out infrared light.

5. The system of claim 3, wherein the second photosensitive sensor comprises a second filter for filtering out light other than light in the second light channel to prevent the light other than the light in the second light channel from reaching the second photosensitive sensor, wherein the second filter is different from the first filter.

6. The system of claim 5, wherein the first filter filters out a first portion of visible light and does not filter out infrared light and the second filter filters out a second portion of visible light and does not filter out infrared light.

7. The system of claim 1, wherein the pixels in the first array of photosensitive pixels are enabled to detect the first spectrum of wavelengths of light based on the first array of photosensitive pixels being sensitive to the first spectrum of wavelengths of light, and wherein the pixels in the second array of photosensitive pixels are enabled to detect the second spectrum of wavelengths of light based on the second array of photosensitive pixels being sensitive to the second spectrum of wavelengths of light.

8. The system of claim 7, further comprising at least one of: a first filter included in the first photosensitive sensor for filtering out a portion of light in the first light channel; or a second filter included in the second photosensitive sensor for filtering out a portion of light in the second light channel.

9. A method for operating a low-light color imaging system, comprising:
   receiving, at a first photosensitive sensor, incident light from a scene, wherein the first photosensitive sensor includes a first array of photosensitive pixels that are enabled to detect a first spectrum of wavelengths of light;
   receiving, at a second photosensitive sensor, incident light from the scene, wherein the second photosensitive sensor includes a second array of photosensitive pixels that are enabled to detect a second spectrum of wavelengths of light, and wherein the second spectrum of wavelengths of light comprises a different spectrum of wavelengths of light than the first spectrum;
   generating, by the first photosensitive sensor, a first set of electrical signals indicative of a first light channel including the first spectrum of wavelengths of light;
   generating, by the second photosensitive sensor, a second set of electrical signals indicative of a second light channel including the second spectrum of wavelengths of light;
   receiving, by an image-combining processor, the first set of electrical signals indicative of the first light channel and the second set of electrical signals indicative of the second light channel;
   generating, by the image-combining processor, a full-color image of the scene based on the first and second sets of electrical signals by combining the first and second sets of electrical signals into a set of color vectors, wherein a color vector comprises an ordered set of numbers describing a color; and translating the set of color vectors into colors in a color space by at least one of using a color lookup table that records associations between color vectors and colors, or using predetermined formulas based on definitions of the first and second light channels, wherein using the color lookup table comprises at least one of:
   searching for a color vector in the color lookup table that matches a color vector in the set of color vectors;
   searching for a color vector in the color lookup table that matches a color vector in the set of color vectors within a predetermined margin; or
   searching for a color vector in the color lookup table with a ratio of elements that matches a ratio of elements of a color vector in the set of color vectors; and displaying by a display, the full-color image.

10. The method of claim 9, wherein the first array of photosensitive pixels and the second array of photosensitive pixels comprise at least one of an array of complementary metal oxide semiconductor (CMOS) pixels, an array of charge-coupled device (CCD) pixels, or an array of organic photodetectors.

11. The method of claim 9, further comprising filtering out, by a first filter included in the first photosensitive sensor, light other than light in the first light channel to prevent the light other than the light in the first light channel from reaching the first photosensitive sensor.

12. The method of claim 11, wherein the filtering out by the first filter filters out a portion of visible light and does not filter out infrared light.

13. The method of claim 11, further comprising filtering out, by a second filter included in the second photosensitive sensor, light other than light in the second light channel to prevent the light other than the light in the second light channel from reaching the second photosensitive sensor, wherein the second filter is different from the first filter.

14. The method of claim 13, wherein the filtering out by the first filter filters out a first portion of visible light and does not filter out infrared light and the filtering out by the second filter filters out a second portion of visible light and does not filter out infrared light.

15. The method of claim 9, wherein the pixels in the first array of photosensitive pixels are enabled to detect the first spectrum of wavelengths of light based on the first array of photosensitive pixels being sensitive to the first spectrum of wavelengths of light, and wherein the pixels in the second array of photosensitive pixels are enabled to detect the second spectrum of wavelengths of light based on the second array of photosensitive pixels being sensitive to the second spectrum of wavelengths of light.

16. The method of claim 15, further comprising at least one of: filtering out, by a first filter included in the first photosensitive sensor, a portion of light in the first light channel; or filtering out, by a second filter included in the second photosensitive sensor, a portion of light in the second light channel.

* * * * *